US009576919B2

(12) United States Patent
Scanlan et al.

(10) Patent No.: US 9,576,919 B2
(45) Date of Patent: *Feb. 21, 2017

(54) SEMICONDUCTOR DEVICE AND METHOD COMPRISING REDISTRIBUTION LAYERS

(71) Applicant: DECA Technologies Inc., Tempe, AZ (US)

(72) Inventors: Christopher M. Scanlan, Chandler, AZ (US); Craig Bishop, Tucson, AZ (US)

(73) Assignee: DECA Technologies Inc., Tempe, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/930,514

(22) Filed: Nov. 2, 2015

(65) Prior Publication Data

US 2016/0093580 A1    Mar. 31, 2016

Related U.S. Application Data

(63) Continuation-in-part of application No. 14/642,531, filed on Mar. 9, 2015, now Pat. No. 9,177,926, which is a continuation of application No. 14/584,978, filed on Dec. 29, 2014, now Pat. No. 9,337,086, which is a continuation of application No. 14/024,928, filed on Sep. 12, 2013, now
(Continued)

(51) Int. Cl.
*H01L 23/00* (2006.01)
*H01L 23/48* (2006.01)
(Continued)

(52) U.S. Cl.
CPC ............ *H01L 24/05* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 4,740,414 A    4/1988  Shasheen
5,548,091 A    8/1996  Distefano et al.
(Continued)

FOREIGN PATENT DOCUMENTS

| JP | 3255970 A | 11/1991 |
|---|---|---|
| WO | WO2009006284 | 1/2009 |
| WO | WO2009009436 | 1/2009 |
| WO | WO2010/080068 A1 | 7/2010 |

OTHER PUBLICATIONS

Hunt, J. Value Engineered Wafer Level Packages for Mobile Devices' ASE Group, Semicon West 2013.*
(Continued)

*Primary Examiner* — Joseph Schoenholtz
(74) *Attorney, Agent, or Firm* — Booth Udall Fuller, PLC

(57) ABSTRACT

A method of making a semiconductor package can include forming a plurality of redistribution layer (RDL) traces disposed over active surfaces of a plurality of semiconductor die and electrically connected to contact pads on the plurality of semiconductor die. The method can include disposing an encapsulant material over the active surfaces, contacting at least four side surfaces of each of the plurality of semiconductor die, and disposed over the plurality of RDL traces. The method can also include forming a via through the encapsulant material to expose at least one of the plurality of RDL traces, forming an electrical interconnect disposed within the via and coupled to the at least one RDL trace, and singulating the plurality of semiconductor packages through the encapsulant material to leave an offset of 30-140 μm of the encapsulant material disposed around a periphery of each of the plurality of semiconductor die.

17 Claims, 11 Drawing Sheets

Related U.S. Application Data

Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600.

(60) Provisional application No. 61/950,743, filed on Mar. 10, 2014, provisional application No. 61/672,860, filed on Jul. 18, 2012.

(51) Int. Cl.
*H01L 21/56* (2006.01)
*H01L 21/768* (2006.01)
*H01L 21/78* (2006.01)
*H01L 21/304* (2006.01)
*H01L 23/31* (2006.01)

(52) U.S. Cl.
CPC ........ *H01L 21/76838* (2013.01); *H01L 21/78* (2013.01); *H01L 23/48* (2013.01); *H01L 24/02* (2013.01); *H01L 24/13* (2013.01); *H01L 24/19* (2013.01); *H01L 24/20* (2013.01); *H01L 24/92* (2013.01); *H01L 24/96* (2013.01); *H01L 23/3114* (2013.01); *H01L 23/3128* (2013.01); *H01L 23/562* (2013.01); *H01L 24/03* (2013.01); *H01L 24/11* (2013.01); *H01L 24/94* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05008* (2013.01); *H01L 2224/05024* (2013.01); *H01L 2224/0558* (2013.01); *H01L 2224/05147* (2013.01); *H01L 2224/05166* (2013.01); *H01L 2224/05548* (2013.01); *H01L 2224/05568* (2013.01); *H01L 2224/05569* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/2101* (2013.01); *H01L 2224/214* (2013.01); *H01L 2224/215* (2013.01); *H01L 2224/92* (2013.01); *H01L 2224/94* (2013.01); *H01L 2224/95001* (2013.01); *H01L 2224/96* (2013.01); *H01L 2924/12041* (2013.01); *H01L 2924/12042* (2013.01); *H01L 2924/13091* (2013.01); *H01L 2924/181* (2013.01); *H01L 2924/18161* (2013.01); *H01L 2924/18162* (2013.01); *H01L 2924/3511* (2013.01)

(56) References Cited

U.S. PATENT DOCUMENTS

| | | | |
|---|---|---|---|
| 7,456,496 | B2 | 11/2008 | Hwee et al. |
| 7,476,980 | B2 | 1/2009 | Rebibis et al. |
| 7,482,203 | B2 | 1/2009 | Song et al. |
| 7,550,857 | B1 | 6/2009 | Longo et al. |
| 7,777,351 | B1 | 8/2010 | Berry et al. |
| 7,829,380 | B2 | 11/2010 | Irsigler et al. |
| 7,843,052 | B1 | 11/2010 | Yoo et al. |
| 8,030,770 | B1 | 10/2011 | Juskey et al. |
| 8,237,259 | B2 | 8/2012 | Pressel et al. |
| 8,288,209 | B1 | 10/2012 | Chi et al. |
| 8,436,255 | B2 | 5/2013 | Goh |
| 8,487,435 | B2 | 7/2013 | Juskey et al. |
| 8,653,674 | B1 | 2/2014 | Darveaux et al. |
| 9,177,926 | B2* | 11/2015 | Scanlan ............... H01L 24/02 |
| 2003/0027373 | A1 | 2/2003 | Distefano et al. |
| 2003/0092217 | A1 | 5/2003 | Coyle |
| 2003/0164554 | A1 | 9/2003 | Fee et al. |
| 2005/0208700 | A1 | 9/2005 | Kwon et al. |
| 2006/0275949 | A1 | 12/2006 | Farnworth et al. |
| 2006/0291029 | A1 | 12/2006 | Lin et al. |
| 2008/0237828 | A1 | 10/2008 | Yang |
| 2009/0243097 | A1* | 10/2009 | Koroku ............... H01L 21/561 |
| | | | 257/737 |
| 2009/0302484 | A1 | 12/2009 | Lee et al. |
| 2010/0052135 | A1 | 3/2010 | Shim et al. |
| 2010/0167471 | A1 | 7/2010 | Jin et al. |
| 2010/0195299 | A1 | 8/2010 | Souriau et al. |
| 2010/0308474 | A1 | 12/2010 | Shibuya et al. |
| 2011/0001215 | A1 | 1/2011 | Lam |
| 2011/0042796 | A1 | 2/2011 | Chang et al. |
| 2011/0095413 | A1 | 4/2011 | Barth et al. |
| 2011/0156250 | A1 | 6/2011 | Goh et al. |
| 2011/0186977 | A1 | 8/2011 | Chi et al. |
| 2011/0193205 | A1 | 8/2011 | Hsieh |
| 2011/0202896 | A1 | 8/2011 | Scanlan et al. |
| 2011/0250396 | A1 | 10/2011 | Matsutani et al. |
| 2012/0032314 | A1 | 2/2012 | Chen et al. |
| 2012/0119373 | A1 | 5/2012 | Hunt |
| 2012/0133001 | A1 | 5/2012 | Tkaczyk et al. |
| 2013/0026658 | A1 | 1/2013 | Chen |
| 2013/0062760 | A1 | 3/2013 | Hung et al. |
| 2013/0168848 | A1 | 7/2013 | Lin et al. |
| 2013/0168849 | A1 | 7/2013 | Scanlan |
| 2013/0270682 | A1 | 10/2013 | Hu et al. |
| 2013/0273698 | A1* | 10/2013 | Shao ................ B29C 43/18 |
| | | | 438/127 |
| 2013/0307140 | A1 | 11/2013 | Huang et al. |
| 2013/0334698 | A1 | 12/2013 | Mohammed et al. |
| 2014/0042600 | A1 | 2/2014 | Kim et al. |
| 2014/0054802 | A1 | 2/2014 | Shim |
| 2014/0057394 | A1 | 2/2014 | Ramasamy et al. |
| 2014/0138788 | A1* | 5/2014 | Kim ............... H01L 27/14618 |
| | | | 257/433 |
| 2015/0137382 | A1* | 5/2015 | Yang ................ H01L 23/481 |
| | | | 257/774 |
| 2015/0162289 | A1* | 6/2015 | Chang ............... H01L 24/96 |
| | | | 257/750 |
| 2015/0243575 | A1* | 8/2015 | Strothmann ........ H01L 23/3114 |
| | | | 257/773 |

OTHER PUBLICATIONS

Kwak, Hocheol and Hubing. Todd, An Overview of Advanced Electronic Packaging Technology, May 1, 2007.

Kripesh, Vaidyanathan et al., Design and Development of a Multi-Die Embedded Micro Wafer Level Package, Institute of Microelectronics, Singapore, 2008.

(56) References Cited

OTHER PUBLICATIONS

Micronews, Fan-in WLCSP matures, what's next?, 3 D Packaging Magazine, Issue 14, Feb. 2008, pp. 2-5.
Th, E.K. et al, Encapsulation Challenges for Wafer Level Packaging, Electronics Packaging Technology Conference, 2009.
R Anderson, et al., Advances in WLCSP Technologies for Growing Market Needs, SMTA's 6th AMual International Wafer Level Packaging Conference, Oct. 27-30, 2009, Santa Clara, CA.
Kanth et al., Design and Development of True-CSP, United Test & Assembly Center Ltd (UTAC).
Hunt, John, Value Engineered Wafer Level Packages for Mobile Devices, Jul. 9, 2013.
Fan et al., Design and optimization of thermo-mechanical reliability in wafer level packaging, Jul. 4, 2009.
Motohashi et al., System in Wafer-Level Package Technology with RDL-first Process, Kanagawa, Japan.
Nishio, 3D package technologies review with gap analysis for mobile application requirements, STATS ChipPAC, Japan, Apr. 22, 2014.
Krohnert et al., System-in-package (SiP) on wafer level, enabled by fan-out WLP (eWLB), Portugal.
Flack et al., Lithography Technique to Reduce the Alignment Errors from Die Placement in Fan-out Wafer Level Packaging Applications, San Jose, CA.
Exposed, Merriam-Webster, merriam-webster.com/dictionary/exposed.
Thick Copper(Cu) RDL, Chipbond website.
Yannou, An overview of recent panel-scale packaging developments throughout the industry, MiNaPAD conference, Grenoble, Apr. 24, 2012.
WLCSP (FiWLP Technology), Wafer level chip scale package.

* cited by examiner

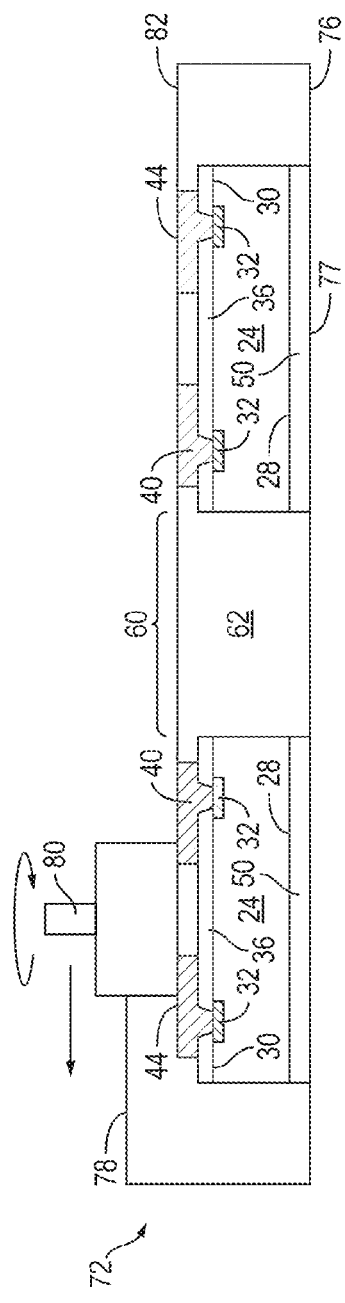
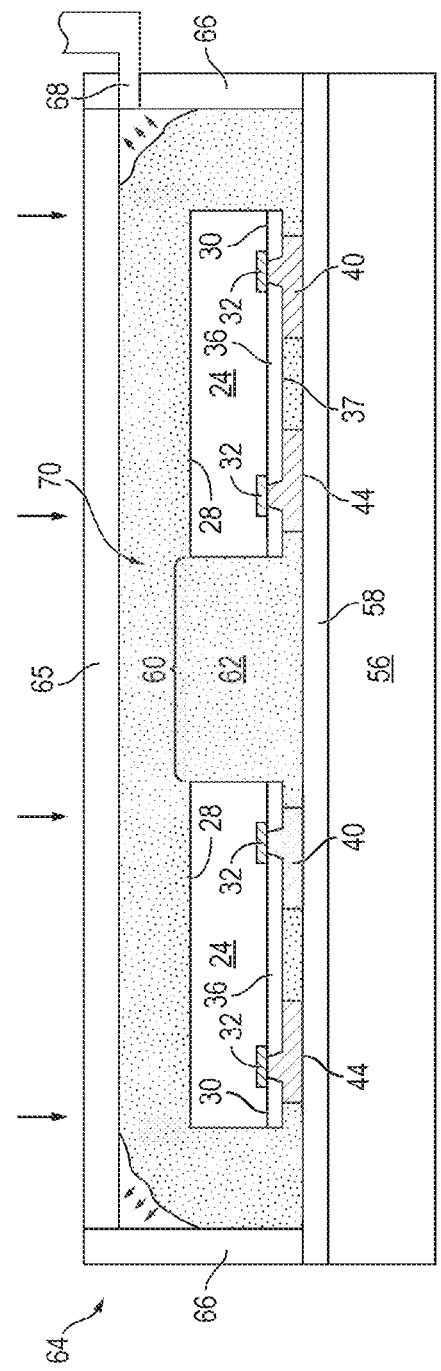
FIG. 2C
FIG. 2D

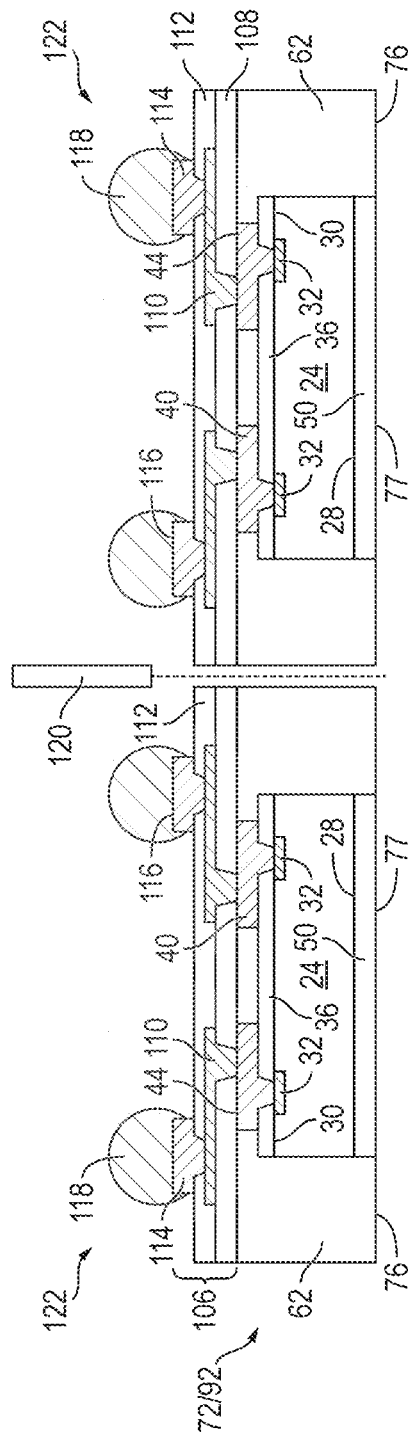
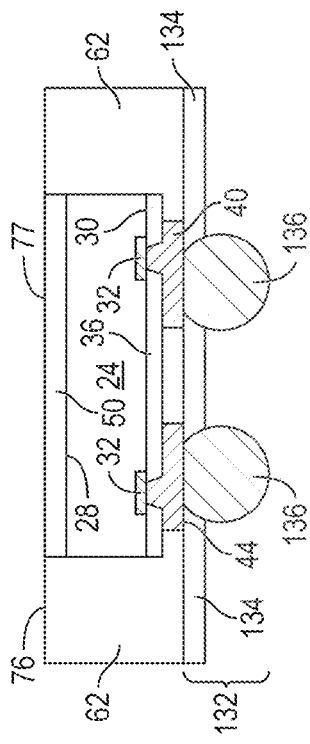
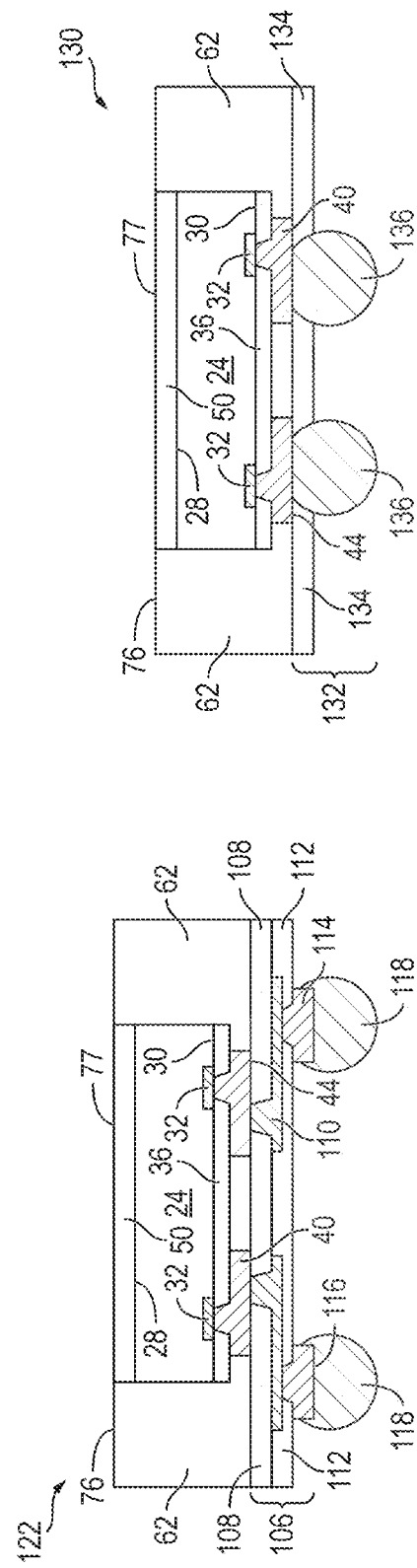

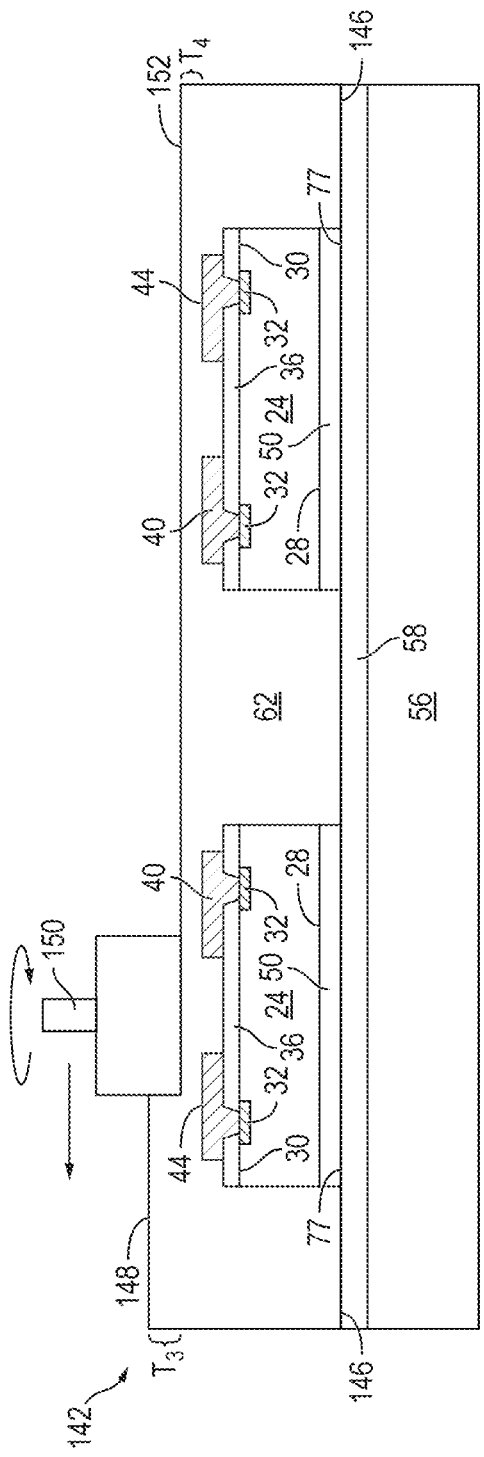
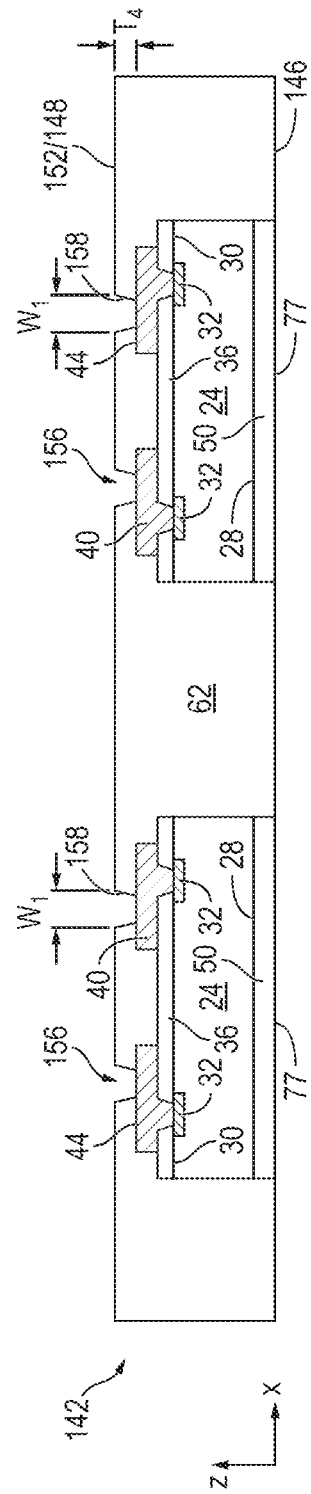
FIG. 5A
FIG. 5B

SEMICONDUCTOR DEVICE AND METHOD COMPRISING REDISTRIBUTION LAYERS

CROSS REFERENCE TO RELATED APPLICATIONS

This application is a continuation in part of U.S. application Ser. No. 14/642,531 entitled "Semiconductor Device and Method Comprising Thickened Redistribution Layers," which was filed on Mar. 9, 2015, which application claims the benefit of U.S. Provisional Patent No. 61/950,743, entitled "Wafer-Level-Chip-Scale-Packages with Thick Redistribution Layer Traces," which was filed on Mar. 10, 2014, and further is also a continuation in part of U.S. application Ser. No. 14/584,978, entitled "Die Up Fully Molded Fan-Out Wafer Level Packaging," which was filed on Dec. 29, 2014, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application is a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, and claims the benefit of the filing date of U.S. Provisional Patent No. 61/672,860, entitled "Fan-Out Semiconductor Package," which was filed on Jul. 18, 2012, the disclosures of each of which are hereby incorporated by this reference in their entireties.

TECHNICAL FIELD

The disclosure relates in general to semiconductor devices and, more particularly, to panelized packaging for embedded semiconductor die packages comprising redistribution layers (RDLs).

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density, active and passive components. Back-end processes may result in semiconductor device packages with a smaller footprint by improvements in electrical interconnection and packaging materials.

One approach to back-end processing that more efficiently produces packaged semiconductor devices is the use of panelized packaging, in which a number of semiconductor die are formed into a panel and processed simultaneously at a level of a reconstituted wafer or panel. Panelized packaging can be used in back-end manufacturing for forming embedded die packages. One form of panelized packaging used to package semiconductor die is FOWLP. FOWLP involves placing multiple semiconductor die "face down" or with an active surface of the semiconductor die oriented toward a temporary carrier or substrate, such as a temporary tape carrier. The semiconductor die and substrate or carrier is overmolded with an encapsulant, such as an epoxy molding compound, using, for example, a compression molding process. After molding, the carrier tape is removed to expose the active surface of the multiple semiconductor die formed together as a reconstituted wafer. Subsequently, a wafer level chip scale package (WLCSP) build-up interconnect structure, typically including a redistribution layer (RDL), is formed on top of the reconstituted wafer or panel. Conductive bumps are then formed over the build-up interconnect structure as a ball grid array (BGA), which is attached to the reconstituted wafer. After formation of the BGA, the reconstituted wafer is singulated to form individual semiconductor devices or packages.

SUMMARY

Accordingly, in an aspect, the present invention can include a method of making a plurality of semiconductor packages that can comprise forming a plurality of redistribution layer (RDL) traces comprising a thickness greater than 8 micrometers (μm) disposed over active surfaces of a plurality of semiconductor die and electrically connected to contact pads on the plurality of semiconductor die. The method can include disposing an encapsulant material over the active surfaces, contacting at least four side surfaces of each of the plurality of semiconductor die, and disposed over the plurality of RDL traces. The method can include forming a via through the encapsulant material to expose at least one of the plurality of RDL traces. The method can include forming an electrical interconnect disposed within the via and coupled to the at least one RDL trace, and singulating the plurality of semiconductor packages through the encapsulant material to leave an offset of 30-140 μm of the encapsulant material disposed around a periphery of each of the plurality of semiconductor die.

The method of making the plurality of semiconductor packages can further comprise forming the plurality of RDL traces comprising a thickness or height greater than 20 μm, and forming the via through the encapsulant material using laser ablation, wherein the encapsulant material is a non-photoimagable mater. The method can further comprise forming the plurality of RDL traces as fan-in structures for each of the plurality of semiconductor die within a footprint of each of their respective semiconductor die. The method can further comprise forming the electrical interconnect as a conductive bump directly contacting the at least one RDL trace, and forming the via with a depth less than or equal to half a height of the conductive bump. The method can further comprise forming the encapsulant material over the plurality of RDL traces with a thickness in a range of 10-40 μm. The method can further comprise forming the encapsulant material over the plurality of RDL traces with a thickness in a range of 10-40 μm. The method can further comprise forming a BGA pad between the RDL and the electrical interconnect. The method can further comprise forming an epoxy coating or dielectric film on the encapsulant material at a frontside or backside of the encapsulant material.

In another aspect, the present invention can be a method of making a semiconductor package comprising forming a plurality of redistribution layer (RDL) traces comprising an thickness greater than 5 μm connected to contact pads on an active surface of a semiconductor die, disposing an encapsulant material over the RDL traces and contacting at least four side surfaces of the semiconductor die to create an offset of 30-140 μm of the encapsulant material around a periphery of the semiconductor die, exposing at least one of the plurality of RDL traces by a via through the encapsulant material, and forming an electrical interconnect disposed within the via and coupled to the at least one RDL trace.

The method of making the semiconductor device can further comprise forming the thickness of the plurality of RDL traces comprising a thickness or height greater than 20 μm so that a height of the RDL traces is greater than a minimum width of the RDL traces, and forming a via through the encapsulant material using laser ablation to expose the at least one of the plurality of thickened RDL traces with respect to the encapsulant material, wherein the encapsulant material is a non-photoimagable material. The method can further comprise forming the encapsulant material over the RDL traces with a thickness of 10-40 μm, and forming the electrical interconnect as a conductive bump at least partially disposed within the via. The method can further comprise forming the plurality of RDL traces for each of the plurality of semiconductor die within a footprint of each of the respective semiconductor die. The method can further comprise forming a BGA pad between the RDL and the electrical interconnect. The method can further comprise forming an epoxy coating or dielectric film over the semiconductor die at a frontside or a backside of the semiconductor package. The method can further comprise disposing encapsulant material over the active surface and at least four side surfaces of the semiconductor die and over the plurality of RDL traces in a single step.

In another aspect, the present invention can be a semiconductor package that can comprise a redistribution layer (RDL) trace comprising an thickness greater than 4 μm disposed over an active surface of a semiconductor die and disposed within a footprint of the semiconductor die, an encapsulant material disposed over the RDL trace and contacting side surfaces of the semiconductor die to create an offset of 30-140 μm of the encapsulant material around a periphery of the semiconductor die, a via formed in the encapsulant material and exposing the RDL trace, and a conductive interconnect disposed within the via and coupled to the RDL trace.

The semiconductor package can further comprise the thickness of the RDL trace comprising a thickness or height greater than 20 μm. The semiconductor package can further comprise the plurality of RDL traces comprising a thickness or height greater than a width. The semiconductor package can further comprise the plurality of RDL traces disposed within a footprint of the semiconductor die. The semiconductor package can further comprise a backside epoxy coating or dielectric film formed at a backside or frontside of the semiconductor package. The semiconductor package can further comprise the via comprising a depth (D), and the electrical interconnect comprising a conductive bump comprising a height (H) greater than or equal to twice a depth of the via.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2G illustrate views of a method of forming a semiconductor package or embedded die package comprising thick conductive RDL traces.

FIG. 3 illustrates a cross-sectional side view of an embodiment of a semiconductor package comprising thick conductive RDL traces.

FIG. 4 illustrates a cross-sectional side view of another embodiment of a semiconductor package comprising thick conductive RDL traces.

FIGS. 5A-5D illustrate views of a method of forming a semiconductor package or embedded die package comprising thick conductive RDL traces.

DETAILED DESCRIPTION

Figure 1A:
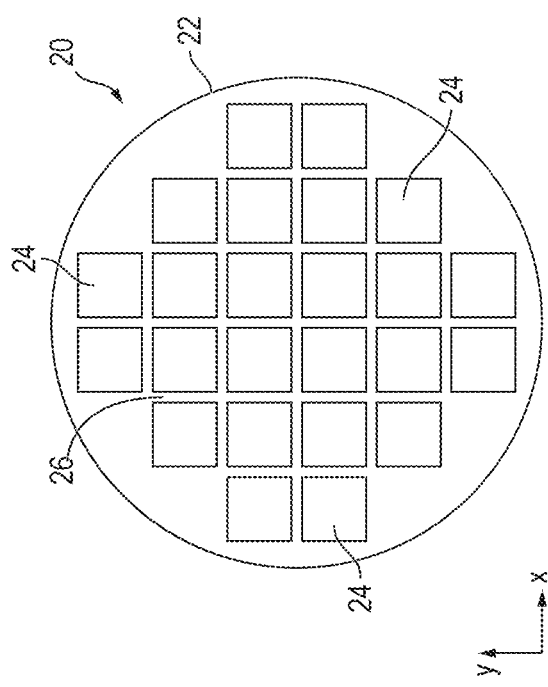
FIGS. 1A-1E illustrate a plurality of semiconductor die comprising thick conductive RDL traces for use in a semiconductor package or embedded die package in accordance with an embodiment of the disclosure.

The present disclosure includes one or more embodiments in the following description with reference to the figures, in which like numerals represent the same or similar elements. It will be appreciated by those skilled in the art that the description is intended to cover alternatives, modifications, and equivalents as may be included within the spirit and scope of the disclosure as defined by the appended claims and their equivalents as supported by the following disclosure and drawings.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography. Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the layer to be patterned such as surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. Alternatively, some types of materials are patterned by directly depositing material into the areas or voids formed by the photoresist or by a previous deposition/etch process using techniques such as electroless and electrolytic plating. The chemistry of photoresists is such that the photoresist remains substantially intact and resists removal by chemical etching solutions or plating chemistries while the portion of the top layers of the semiconductor wafer not covered by the photoresist is removed or is added to by plating. The process of forming, exposing, and removing the photoresist, as well as the process of removing a portion of the semiconductor wafer or adding to a portion of the wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from a relatively nonsoluble condition to a much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer.

Alternatively, photolithography can be accomplished without the use of a photoresist when the material to be patterned is itself photosensitive. In this case, the photosensitive material is coated on the device surface using spin coating, lamination, or other suitable deposition technique. A pattern is then transferred from a photomask to the photosensitive material using light in an operation typically called exposure. In an embodiment, the portion of the photosensitive material subjected to light is removed, or developed, using a solvent, exposing portions of the underlying layer. Alternatively, in another embodiment, the portion of the photosensitive material not subjected to light is removed, or developed, using a solvent, exposing portions of the underlying layer. The remaining portions of the photosensitive film can become a permanent part of the device structure.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, surface lapping machine, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

In the following discussion, certain embodiments are described with regard to the formation of a single die FOWLP, though embodiments of the disclosure are not limited to such. Embodiments of the disclosure may be used in any panelized packaging application including single-die applications, multi-die modules, die embedded in a printed wiring board panel or PCB, some combination of a die(s) and a passive component(s) within a module, or some combination of one or more device unit(s) and another component(s) within a module. In one aspect, embodiments of the disclosure may eliminate or reduce package or module assembly yield loss caused by misalignment of the device unit or other component during panelization. In another aspect, embodiments of the disclosure may maintain compliance to the package or module outline and not require changes to the position of UBM pads or BGA balls. Maintaining compliance with the package or module outline can be consistently achieved in the final product, for example as end-product package, test socket, etc. In another aspect, embodiments of the disclosure may allow for a smaller bond pad opening on the device units.

FIG. 1A shows a plan view of a semiconductor wafer 20 with a base substrate material 22, such as, without limitation, silicon, germanium, gallium arsenide, indium phosphide, or silicon carbide, for structural support. A plurality of semiconductor die or components 24 is formed on wafer 20 separated by a non-active, inter-die wafer area or saw street 26 as described above. Saw street 26 provides cutting areas to singulate semiconductor wafer 20 into individual semiconductor die 24.

Figure 1B:
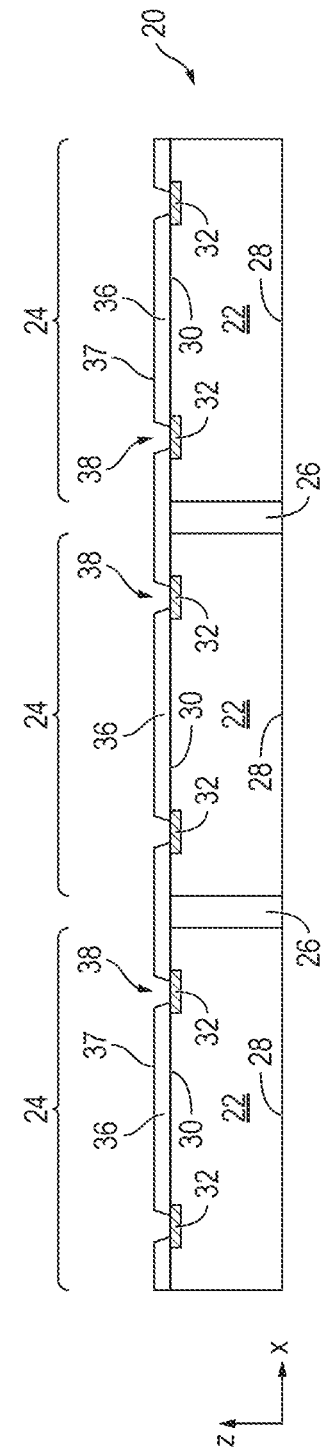

FIG. 1B shows a cross-sectional view of a portion of semiconductor wafer 20 shown previously in the plan view of FIG. 1A. Each semiconductor die 24 has a backside or back surface 28 and active surface 30 opposite the backside. Active surface 30 contains analog or digital circuits implemented as active devices, passive devices, conductive layers, and dielectric layers formed within the die and electrically interconnected according to the electrical design and function of the semiconductor die. For example, the circuit may include one or more transistors, diodes, and other circuit elements formed within active surface 30 to implement analog circuits or digital circuits, such as DSP, ASIC, memory, or other signal processing circuit. Semiconductor die 24 may also contain integrated passive devices (IPDs), such as inductors, capacitors, and resistors, for RF signal processing.

An electrically conductive layer 32 is formed over active surface 30 using PVD, CVD, electrolytic plating, electroless plating process, or other suitable metal deposition process. Conductive layer 32 can be one or more layers of aluminum (Al), copper (Cu), tin (Sn), nickel (Ni), gold (Au), silver (Ag), or other suitable electrically conductive material. Conductive layer 32 operates as contact pads or bond pads electrically connected to the circuits on active surface 30. Conductive layer 32 can be formed as contact pads disposed side-by-side a first distance from the edge of semiconductor die 24, as shown in FIG. 1B. Alternatively, conductive layer 32 can be formed as contact pads that are offset in multiple rows such that a first row of contact pads is disposed a first distance from the edge of the die, and a second row of contact pads alternating with the first row is disposed a second distance from the edge of the die. In another embodiment, conductive layer 32 can be formed as contact pads disposed in an array across an entire surface area of semiconductor die 24. The full array of contact pads can be formed in a regular or irregular pattern across the entire surface of semiconductor die 24 according to the configuration and design of the semiconductor die. Similarly, a size, shape, or orientation of the contact pads can also be irregular with respect to each other and can include a length of conductive material that routes signals laterally across active surface 30 of semiconductor die 24.

FIG. 1B also shows an optional insulating or passivation layer 36 formed over active surface 30 of semiconductor die 24. Insulating layer 36 can be conformally applied to, and have a bottom or first surface that follows the contours of, semiconductor die 24. Insulating layer 36 has a top or second planar surface 37 opposite the first surface. Insulating layer 36 can be an organic or inorganic layer and contain one or more layers of photosensitive low curing temperature dielectric resist, photosensitive composite resist, laminate compound film, solder mask resist film, liquid molding compound, silicon dioxide (SiO2), silicon nitride (Si3N4), silicon oxynitride (SiON), aluminum oxide (Al2O3), or other material having similar insulating and structural properties. Insulating layer 36 can be deposited using printing, spin coating, spray coating, lamination, or other suitable process. A portion of insulating layer 36 can be removed by laser ablation, etching, or other suitable process to expose a bottom surface of openings 38 and contact pads 32 of semiconductor die 24 according to the configuration and design of the semiconductor die. Insulating layer 36 can be patterned to form openings 38 that extend completely through insulating layer 36, after which insulating layer 36 can also be optionally cured.

Figure 1C:
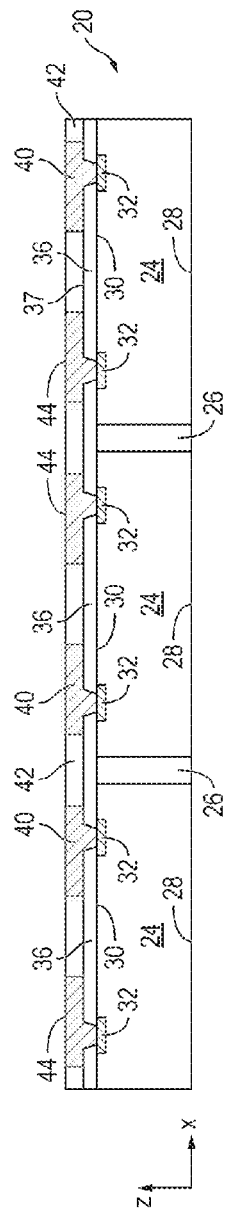

FIG. 1C shows an electrically conductive layer or RDL comprising a plurality of thick RDL traces 40 that can be formed using a patterning and metal deposition process such as sputtering, electrolytic plating, and electroless plating. Thick RDL traces 40 can be one or more layers of Al, Cu, Sn, Ni, Au, Ag, or other suitable electrically conductive material, including seed, barrier, and adhesion layers. Thick RDL traces 40 can be electrically connected to contact pads 32. Other portions of thick RDL traces 40, such as individual RDL traces, can be electrically common or electrically isolated depending on the design and function of semiconductor die 24.

FIG. 1C shows an embodiment in which thick RDL traces 40 can be formed by first depositing and patterning a temporary insulating or passivation layer 42. Insulating layer 42 can be conformally applied to, and have a first surface that follows the contours of, semiconductor die 24, insulating layer 36, or both. Insulating layer 42 can have a second planar surface opposite the first surface. Insulating layer 42 can be an organic or inorganic layer and contain one or more layers of photosensitive low curing temperature dielectric resist, photosensitive composite resist, laminate compound film, solder mask resist film, liquid molding compound, SiO2, Si3N4, SiON, Al2O3, polyimide, or other material having similar insulating and structural properties. Insulating layer 36 can be deposited using printing, spin coating, spray coating, lamination, or other suitable process. Insulating layer 42 can be patterned to form openings completely through the insulating layer and through insulating layer 36, if present, to expose contact pads 32. Insulating layer 36 can also be optionally cured, and can form part of a permanent structure of the final semiconductor package. Alternatively, insulating layer 36 can be a temporary layer, such as a photoresist layer, that is subsequently removed and does not form part of the final structure of the semiconductor die. Insulating layer 42 can be deposited over insulating layer 36, or when optional insulating layer 36 is omitted, over and in contact with semiconductor die 24. A portion of insulating layer 42 can be removed by laser, or when a photoresist layer, can be exposed and removed by an etching development process. Thick RDL traces 40 can then be formed in the removed portion of insulating layer 42 and in openings 38, if present. Openings 38 and the openings in insulating layer 42 can be formed at a same time or at different times. An entirety of thick RDL traces 40 can be formed at a same time, or portions of the conductive layer can be formed at different times. Insulating layer 42 can be removed after the formation of thick RDL traces 40 is complete.

Completed thick RDL traces 40 can be a thick RDL layer comprising a plurality of thick RDL traces for routing electrical signals from semiconductor die 24 to points external to a semiconductor package comprising the semiconductor die. A thickness or height of thick RDL trace 40 can be measured in a z direction that is orthogonal or perpendicular to x and y directions that extend across a top surface of wafer 20 that contains active surfaces 30 of semiconductor die 24, as shown in FIG. 1A. Accordingly, a thickness or height of thick RDL traces 40 can begin at top surface 37 of insulating layer 36 and extend upwards or away from the active surface in a direction opposite of back surface 28, to a top surface 42 of the thick RDL to form a thickness T2. Alternatively, a thickness of or height of thick RDL traces 40 can begin at active surface 30 of semiconductor die 24 and extend upwards or away from the active surface in a direction opposite of back surface 28, to a top surface 42 of the thick RDL to form a thickness T2. The thickness T1 and T2 can comprise a height greater than 4 µm, or a height greater than 5, 10, 15, 18, 20, 25, 30, or 35 µm. In some embodiments, thick RDL traces 40 comprise a thickness in a range of 4-5 µm, 8-9 µm, 4-35, or 5-30 µm. Forming thick RDL traces 40 allows for a single process and structure to provide benefits that would otherwise be accomplished with multiple processes and structures, such as the formation of separate redistribution layers and separate vertical interconnects, such as pillars or copper pillars. Forming thick RDL traces 40 also allows for the thick RDL trace 40 to act as a laser stop for formation of laser ablated vias through the encapsulant over the thick RDL trace 40 to expose the thick RDL trace 40.

Figure 1D:
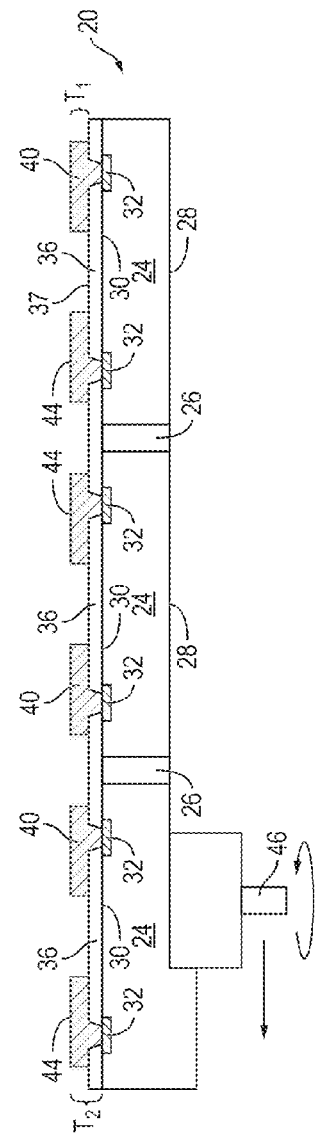

In FIG. 1D, semiconductor wafer 20 undergoes an optional grinding operation with grinder 46 to planarize the surface and reduce thickness of the semiconductor wafer. A chemical etch can also be used to remove and planarize semiconductor wafer 20.

Figure 1E:
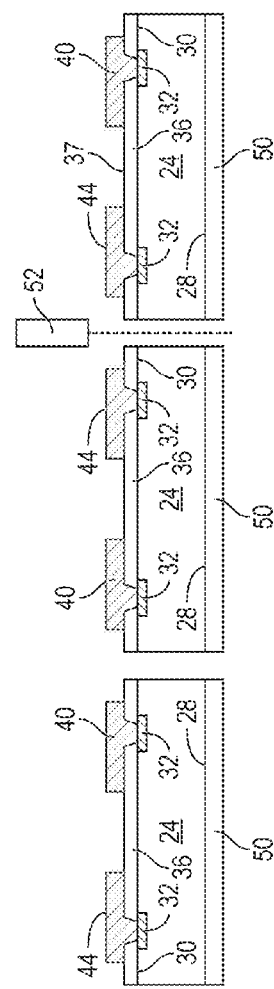

FIG. 1E shows that after a final thickness of semiconductor wafer 20 is achieved, an optional insulating or passivation layer 50 can be formed over a back or lower surface of wafer 20 to cover a back surface 28 of semiconductor die 24. Insulating layer 50 can be an epoxy film, a thermal epoxy, epoxy resin, B-stage epoxy film, ultraviolet (UV) B-stage film with optional acrylic polymer, a dielectric film, or other suitable material. Insulating layer 50 can be disposed over, and can be in direct contact with, an entirety or substantially an entirety of backside 28 of semiconductor die 24, and as such can comprise a footprint substantially equal to a footprint of semiconductor die 24. FIG. 1E also shows semiconductor wafer 20 can be singulated through saw street 26 using a saw blade or laser cutting tool 52 into individual semiconductor die 24 after applying insulating layer 50. Because thick RDL traces 40 can be formed over semiconductor die 24 before the semiconductor die are singulated from their native semiconductor wafer 20, the thick RDL traces can be formed as a fan-in interconnects structure that comprises a footprint or area less than, or contained within, a footprint or area of each respective semiconductor die 24.

Figure 2A:
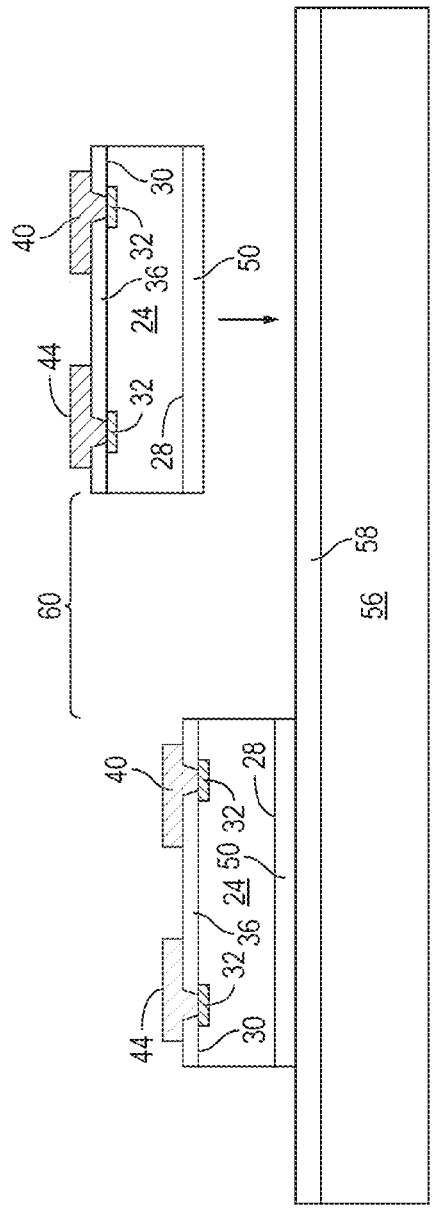
Figure 2B:
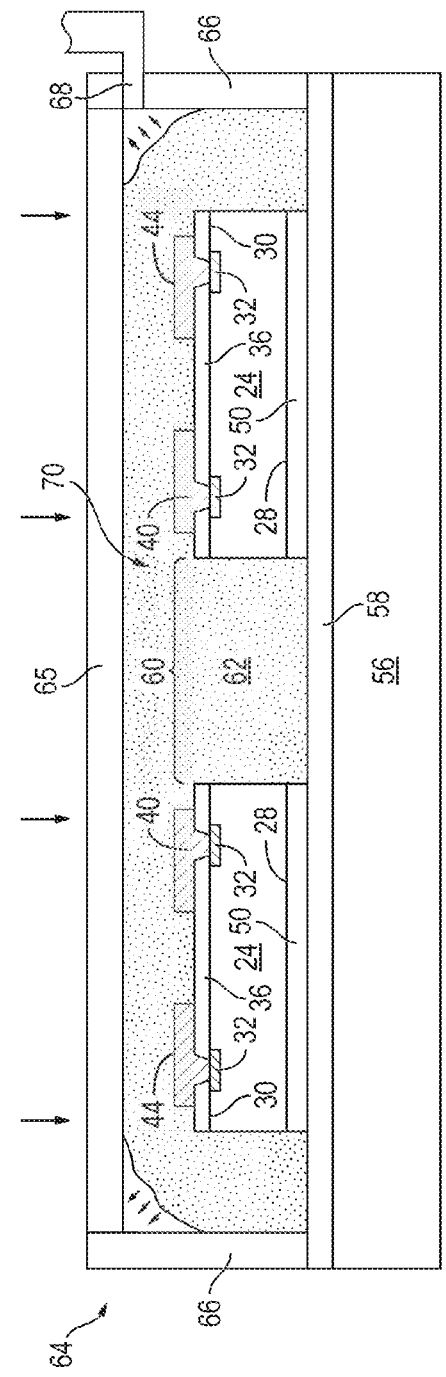

FIG. 2A shows a temporary carrier or substrate 56 containing temporary or sacrificial base material such as silicon, polymer, stainless steel, or other suitable low-cost, rigid material for structural support. An optional interface layer or double-sided tape 58 is formed over carrier 56 as a temporary adhesive bonding film or etch-stop layer. In an embodiment, carrier 56 can be a ring-shaped film frame comprising an open center portion that supports tape 58 at a periphery of the tape. Alternatively, as shown in FIGS. 2A and 2B, carrier 56 can be a flat plate without an open center area that supports tape 58 across an upper surface of carrier 56. A number of fiducial alignment marks can be positioned over or attached to substrate 56 or interface layer 58 for use in properly positioning semiconductor die 24 on carrier 56. Alternatively a portion of substrate 56 or an interface layer 58 can removed or marked to form the fiducial.

FIG. 2A further shows semiconductor die 24 from FIG. 1E mounted face up to carrier 56 and interface layer 58 with backside 28 and insulating layer 50 oriented towards the substrate and active surface 30 oriented away from the carrier. Semiconductor die 24 can be placed over carrier 36 using a pick and place operation or other suitable operation. Semiconductor die 24 are positioned with respect to fiducial 39 according to a nominal or predetermined position and spacing for the semiconductor die. Semiconductor die 24 are mounted to carrier 56 such that the semiconductor die are separated by a space or gap 60 when mounted over carrier 56 that can provides an area for a subsequently formed interconnect structure, such as a fan-out interconnect structure, as part of a final semiconductor package. A size of gap 60 includes sufficient area for optionally mounting semiconductor devices or components within the subsequently formed semiconductor packages.

FIG. 2B shows an encapsulant 62 is deposited using a paste printing, compression molding, transfer molding, liquid encapsulant molding, lamination, vacuum lamination, spin coating, or other suitable applicator. Specifically, FIG. 2B shows a mold 64 with a plurality of sidewalls 66 brought together with top portion or plate 65, carrier 56, and interface layer 58 to enclose semiconductor die 24 within the mold for subsequent encapsulation. Mold 64 can also include a bottom portion on which carrier 56 is placed and to which sidewalls 66 can be in contact. In an embodiment, carrier 56 and interface layer 58 can serve as the bottom mold portion for the subsequent encapsulation process. Alternatively, semiconductor die 24, carrier 56, and interface layer 58 can be disposed within a mold including multiple portions, such as top and bottom portions. Mold 64 is brought together by moving mold 64 around semiconductor die 24, or alternatively, by moving the semiconductor die into the mold.

FIG. 2B further shows mold 64 encloses semiconductor die 24 with a cavity or open space 70. Cavity 70 extends between mold 64 to semiconductor die 24 and interface layer 58. A volume of encapsulant 62 is disposed over semiconductor die 24 and carrier 56. Inlet 68 can be an exhaust port that does not provide an escape path for encapsulant 62. Encapsulant 62 can be a polymer composite material, such as epoxy resin with filler, epoxy acrylate with filler, or polymer with proper filler. The volume of encapsulant 62 is measured according to the space requirements of cavity 60 less the area occupied by semiconductor die 24 and any additional semiconductor devices that might be present. Encapsulant 62 is disposed over and around semiconductor die 24 and between sidewalls 64. Encapsulant 62 can also be disposed over and around thick RDL traces 40 so that the same encapsulant and encapsulation process disposes the encapsulant between and among the thick RDL traces of the RDL. Encapsulant 62 can contact sidewalls of the thick RDL traces so that a single encapsulant 62 can be in direct contact with, and extend along sides of, semiconductor die 24 and thick RDL traces 40 to be disposed over the side surfaces and over active surface of the semiconductor die.

Top portion 65 of mold 64 can move along sidewalls 66 toward encapsulant 62 and semiconductor die 24 until the top portion contacts the encapsulant to evenly disperse and uniformly distribute encapsulant 62 within cavity 70 around semiconductor die 24. A viscosity and elevated temperature of encapsulant 62 can be selected for uniform coverage, for example, a lower viscosity and elevated temperature can increase the flow of the encapsulant for molding, paste printing, and spin coating. The temperature of encapsulant 62 can also be controlled within cavity 70 to promote curing of the encapsulant. Semiconductor die 24 are embedded together in encapsulant 62, which is non-conductive and environmentally protects the semiconductor device from external elements and contaminants.

When vacuum compression molding is used, a sacrificial release film can be disposed between top portion 65 and sidewalls 66 of cavity 70 and encapsulant 62 within the cavity to prevent the encapsulant from sticking, or attaching, to the top portion and sidewalls of the cavity. When other types of molding are used, such as transfer molding, the sacrificial release film can be omitted and encapsulant 62 can contain a mold release agent, or an interior surface of cavity 70 can be treated with a mold release agent to prevent the encapsulant from attaching to the interior surface of the mold.

In FIG. 2C, semiconductor die 24 are removed from mold 64 with encapsulant 62 as a panel or embedded die panel 72. Panel 72 can optionally undergo a curing process to cure encapsulant 62. Carrier 56 and interface layer 58 can be removed by chemical etching, mechanical peeling, CMP, mechanical grinding, thermal bake, UV light, laser scanning, wet stripping, or other suitable process to expose a back surface 76 of encapsulant 62 opposite front surface 78 of the encapsulant. In an embodiment, encapsulant 62 is cured, either partially or entirely, before carrier 56, interface layer 58, or both, are removed. Alternatively, encapsulant 62 can be cured, either partially or entirely, after carrier 56, interface layer 58, or both are removed.

Back surface 76 of panel 72 can be substantially coplanar with a back surface 77 of insulating layer 50. Both back surface 76 and back surface 77 can be exposed by the removal of carrier 56 and interface layer 58. After removal of carrier 56 and interface layer 58, FIG. 2C shows encapsulant 62 disposed around semiconductor die 24 within embedded die panel 72. Panel 72 can include a footprint or form factor of any shape and size that allows for, and facilitates, the subsequent processing required to form semiconductor packages as described in greater detail below. As a non-limiting example, panel 72 can include a form factor similar to the form factor of a 300 millimeter (mm) semiconductor wafer and include a circular footprint having a diameter of 300 mm. Panel 72 can also be of any other desirable size, and can include shapes or formats such as rectangular or square. In an embodiment, panel 72 can be what is known in the art as a reconstituted wafer.

FIG. 2C shows that panel 72 can undergo a grinding operation with grinder 80 to reduce a thickness of panel 72 to remove surface 78 and to expose a portion of thick RDL traces 40, such as surface 44 the RDL traces, and to expose a new front surface 82 of encapsulant 62 or panel 72 that is substantially coplanar with surface 44 of RDL traces 40. A chemical etch can also be used to remove and planarize a portion of encapsulant 62 in panel 72. Thus, RDL traces 40 that are coupled to contact pads 32 of semiconductor die 24 can be exposed with respect to encapsulant 62 at surface 82 of panel 72 to provide for electrical connection between semiconductor die 24 and points external to the subsequently formed semiconductor package. Because a thickness of encapsulant 62 is reduced to expose thick RDL traces 40 that comprise thickness T1, a thickness of encapsulant 62 over active surface 30 of semiconductor die 24 can also be equal, or substantially equal, to thickness T1. A thickness of insulating layer 50 disposed on or over back surface 28 of semiconductor die 24 can also be formed to have a thickness equal or substantially equal to thickness T1 so that a thickness of insulating layer 50 disposed on back surface 28 of semiconductor die 24 can similar, or equal, to the final thickness of encapsulant 62 disposed over or on the active surface 30 to counterbalance package forces and reduce warpage.

In embodiments in which a portion of the thick RDL trace 40 is exposed by grinding with grinder 80, a thickness of the thick RDL trace 40 can be in a range of, or substantially equal to, 15-35 μm or 20-30 μm. In other embodiments in which a portion of the thick RDL trace 40 is exposed by laser ablation, as discussed with respect to FIG. 5A, the thickness of the thick RDL trace 40 can be less than the thickness of the thick RDL trace 40 when the thick RDL trace 40 is exposed by grinding. As a non-limiting example, the thickness of the thick RDL trace 40 and can include a thickness in a range of, or substantially equal to, 4-20 μm when the thick RDL trace 40 is exposed by laser ablation or other non-grinding process. As used herein, substantially equal to can include plus or minus 1 μm, 2 μm, or 3 μm, as well as less than 1 μm of thickness of the thick RDL traces 40.

FIG. 2D shows another embodiment in which semiconductor die 24 from FIG. 1E can be mounted face down to carrier 56 and interface layer 58 with active surface 30 oriented toward the carrier and back surface 28 oriented away from the carrier. Semiconductor die 24 can be placed over carrier 56 using a pick and place operation or other suitable operation. Mounting semiconductor die 24 in a face down configuration can be advantageous when thick RDL traces 40 are formed over semiconductor die 24 and connected to contact pads 32 before the semiconductor die are placed over carrier 36 or interface layer 38 and thickness T1 provides sufficient offset to allow encapsulant 62 to be disposed within a thickness, height, or offset, from a top surface 44 of thick RDL traces 40 and active surface 30 of semiconductor die 24 or a top surface 37 of insulating layer 36.

FIG. 2D further shows mold 64 can enclose semiconductor die 24 with cavity 70 to encapsulate semiconductor die 24 with a volume of encapsulant 62 in a manner similar to that described above with respect to FIG. 2B.

Figure 2E:
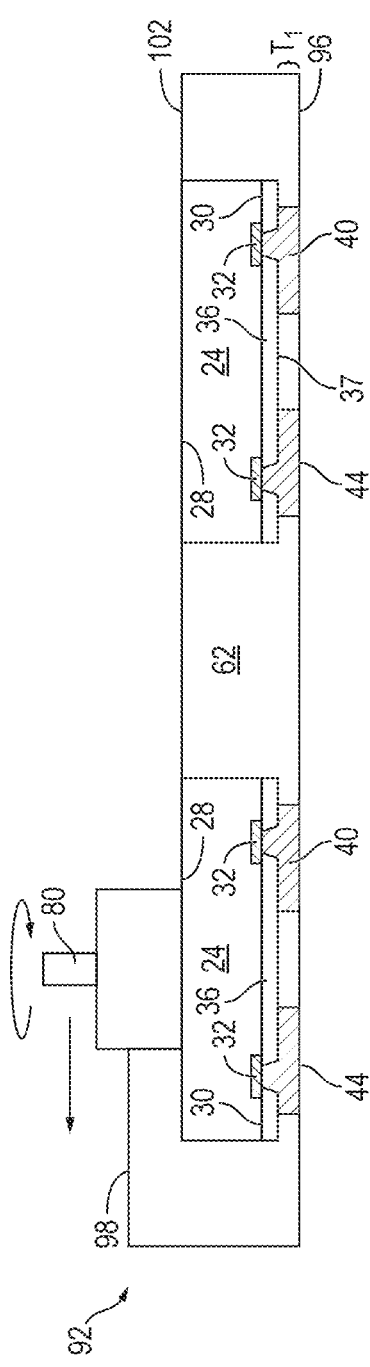

In FIG. 2E, semiconductor die 24 are removed from mold 64 with encapsulant 62 as a panel or embedded die panel 92. Panel 72 can include a footprint or form factor of any shape and size that allows for, and facilitates, the subsequent processing required to form semiconductor packages as described in greater detail below. As a non-limiting example, panel 72 can include a form factor similar to the form factor of a 300 mm semiconductor wafer and include a circular footprint having a diameter of 300 mm. Panel 72 can also be of any other desirable size, and can include shapes or formats such as rectangular or square. In an embodiment, panel 72 can be what is known in the art as a reconstituted wafer.

Panel 92 can optionally undergo a curing process to cure encapsulant 62. Carrier 56 and interface layer 58 can be removed by chemical etching, mechanical peeling, CMP, mechanical grinding, thermal bake, UV light, laser scanning, wet stripping, or other suitable process to expose a front surface 96 of encapsulant 62 opposite back surface 98 of the encapsulant. In an embodiment, encapsulant 62 is cured, either partially or entirely, before carrier 56, interface layer 58, or both, are removed. Alternatively, encapsulant 62 can be cured, either partially or entirely, after carrier 56, interface layer 58, or both are removed.

After removal of carrier 56 and interface layer 58, FIG. 2E shows front surface 96 of panel 92 can be substantially coplanar with surface 44 of RDL traces 40. Thus, RDL traces 40 that are coupled to contact pads 32 of semiconductor die 24 can be exposed with respect to encapsulant 62 at surface 96 of panel 92 to provide for electrical connection between semiconductor die 24 and points external to the subsequently formed semiconductor package.

FIG. 2E shows that panel 92 can undergo a grinding operation with grinder 80 to reduce a thickness of panel 92 to remove surface 98 and to expose a portion of back surface 28 of semiconductor die 24. A chemical etch can also be used to remove and planarize a portion of encapsulant 62 in panel 72. Reducing a thickness of panel 92 can occur before or after the removal of carrier 56 and tape 58. In some embodiments, encapsulant 62 can be in direct contact with back surface 28 of semiconductor die 24, and a thickness of encapsulant 62 can be left during the removal or grinding of the encapsulant so that a thickness of encapsulant 62 is disposed over back surface 28. In some embodiments, a thickness of the encapsulant that remains over back surface 28 can be equal or substantially equal to thickness T1, or a thickness of encapsulant disposed over active surface 30 of the semiconductor die. As such, opposing thicknesses of encapsulant over back surface 28 and active surface 30 can be equal or approximately equal to balance forces on opposing sides of the subsequently formed package to reduce or minimize warping within the package.

Figure 2F:
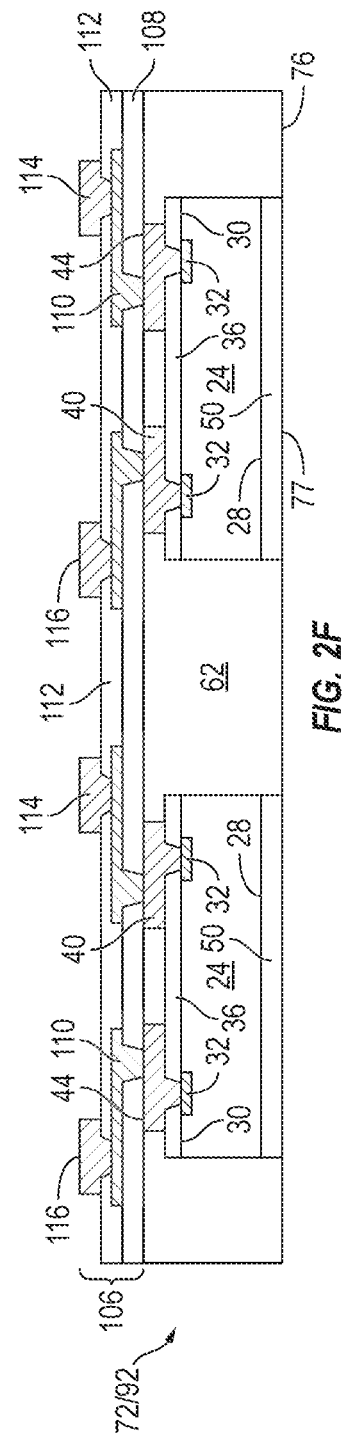

FIG. 2F shows a build-up interconnect structure 106 can be formed over panel 72 or over panel 92 to provide for electrical connection between semiconductor die 24 and thickened RDL traces 44 and points external to the subsequently formed semiconductor package. Accordingly, the processing shown subsequently in FIGS. 2F and 2G can proceed from panel 72 shown in FIGS. 2B and 2C or from panel 92 shown in FIGS. 2D and 2E. However, for convenience, FIGS. 2F and 2G are described with respect to panel 72. Build-up interconnect structure 106 can comprise a number of RDLs comprising RDL traces, which can comprise part of a fan-out interconnect structure. Build-up interconnect structure 106 can be formed by the deposition and patterning of various insulating or passivation layers and the deposition and patterning of various conductive layers.

FIG. 2F shows a non-limiting example of a build-up interconnect structure in which insulating layer 108 is conformally applied to, and can have a first surface that follows the contours of, encapsulant 62 and top surface 44 of thick RDL traces 42. Insulation layer 108 can have a second planar surface opposite the first surface. Insulating layer 108 can contain one or more layers of photosensitive low curing temperature dielectric resist, photosensitive composite resist, liquid crystal polymer (LCP), laminate compound film, insulation paste with filler, solder mask resist film, liquid molding compound, granular molding compound, polyimide, benzocyclobutene (BCB), polybenzoxazoles (PBO), SiO2, Si3N4, SiON, Ta2O5, Al2O3, or other material having similar insulating and structural properties. Insulating layer 108 can be deposited using printing, spin coating, spray coating, lamination, or other suitable process. Insulating layer 108 can be subsequently patterned and cured using UV exposure followed by developing, or other suitable process. A portion of insulating layer 108 can be removed by laser ablation, etching, or other suitable process to form openings that expose portions of top surface 44 of thick RDL traces 42, according to the configuration and design of semiconductor die 24 and the final semiconductor package.

An electrically conductive layer 110 can be patterned and deposited over, and in contact with, thick RDL traces 42, encapsulant 62, and insulation layer 108. Conductive layer 110 can be one or more layers of Al, Cu, Sn, Ni, Au, Ag, or other suitable electrically conductive material, and can include one or more of a seed layer, adhesion layer, or barrier layer. The deposition of conductive layer 110 can use PVD, CVD, electrolytic plating, electroless plating, or other suitable process. The openings in insulation layer 108 can extend completely through the insulation layer over thick RDL traces 40. Conductive layer 110 can operate as an RDL comprising a plurality of RDL traces that assist in extending electrical connection from semiconductor die 24 and thick conductive RDL traces 40 to points external to semiconductor die 24. A portion of conductive layer 110 formed within the openings in insulating layer 108 can form vertical interconnect structures or vias that provide electrical interconnection through insulating layer 108. While a non-limiting example of a build-up interconnect structure 106 is illustrated in FIG. 2F comprising a single RDL 110, additional RDLs can also be formed within build-up interconnect structure 106 between conductive layer 114 and thick RDL 40 to provide additional flexibility for routing signals between semiconductor die 24 and points external to semiconductor die 24.

FIG. 2F further shows an insulating or passivation layer 112 is conformally applied to, and follows the contours of, insulation layer 108 and conductive layer 110. Insulating layer 112 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 112 can be deposited using printing, spin coating, spray coating, lamination, or other suitable process. Insulating layer 112 can be subsequently patterned and cured using UV exposure followed by developing, or other suitable process. A portion of insulating layer 112 can be removed by laser ablation, etching, or other suitable process to form openings through the insulating layer that expose portions of conductive layer 110.

An electrically conductive layer 114 can be patterned and deposited over, and be in contact with, conductive layer 110 and insulating layer 112. Conductive layer 114 can be one or more layers of Al, Cu, Sn, Ni, Au, Ag, or other suitable electrically conductive material. The deposition of conductive layer 114 can use PVD, CVD, electrolytic plating, electroless plating, or other suitable process. The openings in insulating layer 112, into which conductive layer 114 can be disposed, can extend completely through the insulation layer over conductive layer 110. At least a portion of conductive layer 114 can be formed within the openings in insulating layer 112 and form a vertical interconnect structure or vias that provide electrical interconnection through insulating layer 112 to connect to conductive layer 110.

Conductive layer 114 can comprise a top portion or surface that is formed as a pad 116. Pad 116 can comprise a horizontal component that includes an area greater than an area of the opening formed in insulating layer 112 such that pad 116 of conductive layer 114 extends over a top or upper surface of insulating layer 112. Pad 116 of conductive layer 114 can be an input/output (I/O) interconnect at a periphery of a completed semiconductor package. As such, pad 116 can be formed as an under bump metallization (UBM) pad, which as described in greater detail below with respect to FIG. 2G, can form an interface between signals transmitted with respect to semiconductor die 24 and the package I/O interconnects. Alternatively, pads 116 can be formed as land grid array (LGA) pads that are themselves I/O interconnects at a periphery of a completed semiconductor package, and are not coupled to other I/O interconnects such as, for example, solder bumps. Pads 116 can be stacks of multiple metal layers including adhesion, barrier, seed, and wetting layers. Pads 116 can comprise one or more layers of Ti, titanium nitride (TiN), titanium tungsten (TiW), Al, Cu, chromium (Cr), chromium copper (CrCu), Ni, nickel vanadium (NiV), Pd, platinum (Pt), Au, Ag or other suitable material or combination of materials. In an embodiment, pads 116 can comprise a TiW seed layer, a Cu Seed layer, and a Cu UBM layer.

FIG. 2G shows an electrically conductive bump material can be deposited over pads 116, which as indicated above, can be UBM pads that act as an intermediate conductive layer between semiconductor die 24 and subsequently formed solder bumps or other I/O interconnect structures. Pads 116 can comprise UBM pads that provide a low resistive interconnect to conductive layer 110 and thick RDL traces 40, and can also provide a barrier to solder diffusion, and an increase in solder wettability. An electrically conductive bump material can be deposited over pads 116 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to pads 116 using a suitable attachment or bonding process. In an embodiment, the bump material is reflowed by heating the material above its melting point to form spherical balls or bumps 118. In some applications, bumps 118 are reflowed a second time to improve electrical contact to pads 116. Bumps 118 can also be compression bonded to pads 116. Bumps 118 represent one type of interconnect structure that can be formed over pads 116. Other interconnect structures can also be used, including conductive paste, stud bump, micro bump, or other electrical interconnect. Additionally, bumps 118 can be omitted in order to form a quad-flat non-leads (QFN) package or a land grid array (LGA) package.

FIG. 2G also shows that after the formation of package I/O interconnects, such as bumps 116, panel or reconstituted wafer 72 can be singulated using a saw blade or laser cutting tool 120 to form individual semiconductor packages or embedded die packages 122.

FIG. 3 shows an individual semiconductor package or embedded die package 122 that is produced by the process illustrated in FIGS. 1A-2G. Accordingly, the method illustrated in FIGS. 1A-2G and semiconductor package 122 shows a process in which a thick RDL layer can comprise a fan-in build-up structure formed over and in contact with a semiconductor wafer or native device wafer. The thick RDL layer can comprise a plurality of RDL traces comprising a thickness or height at least 20 μm in a z direction that is perpendicular to, and extends away from, an active surface of the semiconductor die. A thickness of the semiconductor wafer or native device wafer can also be reduced or thinned, such as by a grinding process. An epoxy film (such as a solder mask laminate film or die attach epoxy film) can be applied on backside of the semiconductor wafer. Individual semiconductor die can be formed or separated from the semiconductor wafer by dicing the semiconductor wafer.

The device of FIG. 3 and the process illustrated in FIGS. 1A-2G also show a release film or tape can be applied to temporary carrier or substrate. A plurality of semiconductor die can be placed in an array across a surface of the carrier in a face up position with an active surface of the semiconductor die oriented away from the carrier, or alternatively in a face down position. A spacing among the semiconductor die mounted to the carrier can be sufficient for additional fan-out structures to be coupled to the semiconductor die while being formed within the final semiconductor package. The semiconductor die can be compression molded to encapsulate front or active surfaces as well as at least four side surfaces of the semiconductor die. An insulating layer or film can be disposed on the back surface of the semiconductor die. A thickness of the film disposed on the back surface of the semiconductor die can similar to or equal to the final thickness of the encapsulant, epoxy mold compound, or laminate film, disposed over or on the active surface of the semiconductor die. The encapsulated semiconductor die can form a molded panel that is removed from the carrier, after which the encapsulant can be cured. After curing, the encapsulant can be cured and then polished or ground to ensure a surface of all the thick RDL traces are exposed. A fan-out RDL build-up structure and solder balls can be subsequently formed on the molded panel and coupled or electrically connected to the thickened RDL traces. In some embodiments, the solder balls or bumps can be omitted in order to make QFN or LGA packages. Alternatively, a solder mask (either of the dry film or liquid type) can be applied over or directly on top of the molded panel and patterned to form openings that expose desired portions of the fan-in thick RDL traces, or desired portions of the fan-out RDL build-up structure, after which solder balls or bumps can be placed in the solder mask openings. The panel can then be singulated or saw-singulated into individual devices.

By forming semiconductor packages as shown with respect to FIG. 3, the final semiconductor package can comprise an active surface and at least four side surfaces that are encapsulated with a single mold compound. The mold compound can also be disposed around the thick RDL traces that can be formed or plated on the semiconductor die while the semiconductor die are still part of their native semiconductor wafer. The semiconductor die and thick RDL traces can be molded after having been placed face up on a temporary carrier. The thick RDL traces can be exposed by grinding or removing a portion of the molding to produce an encapsulated fan-in package. A build-up fan-out structure can be subsequently built over the encapsulated fan-in thick RDL structure. As such, the encapsulation or molding process can be more easily accomplished in a single step than with previous structures and methods requiring a second or separate molded underfill material. Additionally, good control of package thickness is achieved through removal or grinding down of encapsulant to a known thickness when exposing thick RDL traces, which allows for improvement or optimization of warpage of the semiconductor package through modulation of epoxy thickness.

By forming semiconductor packages as discussed above, flipping of the semiconductor die after singulation from the native wafer is not required for subsequent placement of the semiconductor die on the temporary carrier. By removing a need for die flipping as part of the placement process, semiconductor die placement can be accomplished more quickly and with lower equipment cost. Because cost of semiconductor die placement can be a significant cost for packaging semiconductor die, reducing cost for semiconductor die placement during packaging can bring substantial cost saving advantages. Similarly, forming thick RDL traces allows for a single process and structure to provide benefits that would otherwise be accomplished with multiple processes and structures, such as the formation of separate redistribution layers and vertical interconnects, such as copper pillars. Advantageously, a fan-out semiconductor package can thus be formed in which a fan-out RDL build-up structure is applied entirely to mold compound. Accordingly, the semiconductor device and method described herein can, because of the described advantages, potentially displace high volume package technologies such as QFN packages and flip-chip ball grid array (FBGA) packages by providing a low cost, manufacturable process with additional design flexibility compared to traditional fan-out structures.

FIG. 4 shows an individual semiconductor package or embedded die package 130 similar to semiconductor package 122 from FIG. 3. Semiconductor package 130 differs from semiconductor package 122 by the inclusion of build-up interconnect structure 132 instead of build-up interconnect structure 106. Thus, continuing from FIG. 2C or 2E, build-up interconnect structure 132 can be formed by depositing insulating layer 134 over, and in contact with, thick conductive RDL traces 40 and encapsulant 62. Insulating layer 134 can be conformally applied to, and can have a first surface that follows the contours of, encapsulant 62 and top surface 44 of thick RDL traces 42. Insulation layer 134 can have a second planar surface opposite the first surface. Insulating layer 134 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 134 can be deposited using printing, spin coating, spray coating, lamination, or other suitable process. Insulating layer 134 can be subsequently patterned and cured using UV exposure followed by developing, or other suitable process. A portion of insulating layer 134 can be removed by laser ablation, etching, or other suitable process to form openings that expose portions of top surface 44 of thick RDL traces 42, according to the configuration and design of semiconductor package 130. In an embodiment, insulting layer 134 can be an organic or inorganic passivation film that can help prevent reliability failures under electrical bias.

FIG. 4 also shows an electrically conductive bump material can be deposited over, and in direct contact with, thick conductive RDL traces 40. An electrically conductive bump material can be deposited over pads 116 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to thick conductive RDL traces 40 using a suitable attachment or bonding process. In an embodiment, the bump material is reflowed by heating the material above its melting point to form spherical balls or bumps 136. In some applications, bumps 136 are reflowed a second time to improve electrical contact to thick conductive RDL traces 40. Bumps 136 can also be compression bonded to thick conductive RDL traces 40. Bumps 136 represent one type of interconnect structure that can be formed over thick conductive RDL traces 40. Other interconnect structures can also be used, including conductive paste, stud bump, micro bump, or other electrical interconnect.

Figure 5C:
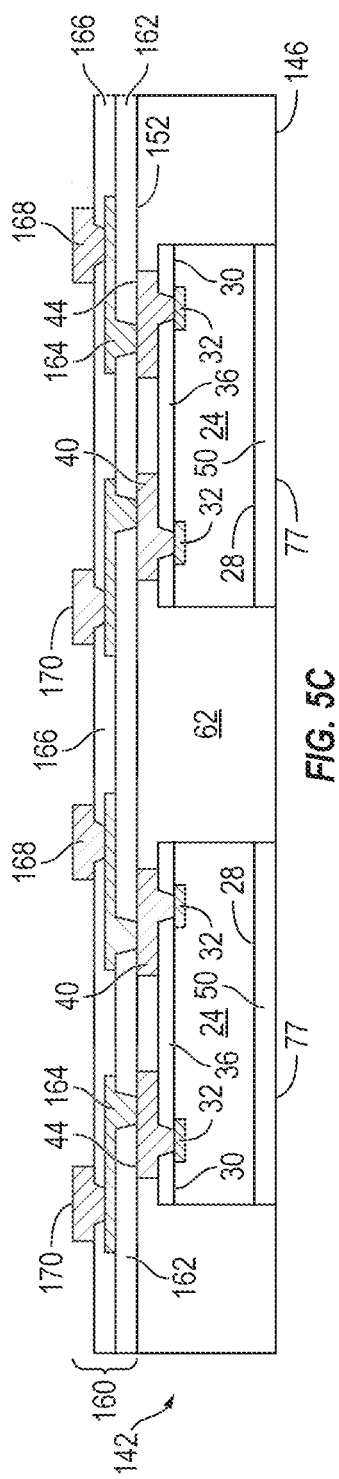

FIGS. 5A-5D show another embodiment for a method of making a semiconductor package comprising thick conductive RDL traces. FIG. 5A, continuing from FIG. 2B, shows semiconductor die 24 are removed from mold 64 with encapsulant 62 as a panel or embedded die panel 142. Panel 142 can optionally undergo a curing process to cure encapsulant 62. Back surface 146 of panel 142 can be comprised of back surface 146 of encapsulant 62 and back surface 77 of insulation layer 50, which can be substantially coplanar with respect to each other. Both back surface 146 of encapsulant 62 and back surface 77 of insulating layer 50 can be exposed by the removal of carrier 56 and interface layer 58, as shown below in FIG. 5B. As shown in FIG. 5A, encapsulant 62 can be disposed around semiconductor die 24 within embedded die panel 142. Panel 142 can include a footprint or form factor of any shape and size that allows for, and facilitates, the subsequent processing required to form semiconductor packages as described in greater detail below. As a non-limiting example, panel 142 can include a form factor similar to the form factor of a 300 mm semiconductor wafer and include a circular footprint having a diameter of 300 mm. Panel 142 can also be of any other desirable size, and can include shapes or formats such as rectangular or square. In an embodiment, panel 142 can be what is known in the art as a reconstituted wafer.

FIG. 5A shows that panel 142 can undergo a grinding operation with grinder 150 to reduce a thickness of panel 142 and to remove or planarize front surface 148 of encapsulant 62. A chemical etch can also be used to remove and planarize a portion of encapsulant 62 in panel 142. The grinding operation can produce or reveal a new front surface 152 of encapsulant 62 that is disposed over thick RDL traces 40. New front surface 152 can be revealed by removing a thickness T3 of encapsulant 62 from front surface 148 of the encapsulant. Front surface 152 can be offset from surface 44 of RDL traces 40 by a thickness or distance T4. Alternatively, when a desired thickness T4 is substantially equal to a thickness or offset between traces 40 and front surface 148 that is controlled during a molding process, the thickness T4 of the encapsulant can remain substantially the same and the grinding operation or chemical etch can keep thickness T4 substantially equal to an after mold thickness by planarizing front surface 148 without removing a substantial thickness T4 of encapsulant 62.

FIG. 5B shows carrier 56 and interface layer 58 can be removed from panel 142 by chemical etching, mechanical peeling, CMP, mechanical grinding, thermal bake, UV light, laser scanning, wet stripping, or other suitable process to expose a back surface 146 of encapsulant 62 opposite front surface 148 of the encapsulant. In an embodiment, encapsulant 62 is cured, either partially or entirely, before carrier 56, interface layer 58, or both, are removed. Alternatively, encapsulant 62 can be cured, either partially or entirely, after carrier 56, interface layer 58, or both are removed. Similarly, carrier 56 and interface layer 58 can be removed before or after the grinding or planarization of encapsulant 62.

As further shown in FIG. 5B, openings 156 can be formed in front surface 148 or front surface 152 of encapsulant 62 by laser ablation, etching, or other suitable process, such as a non-grinding process. Openings 156 can extend completely through a portion of encapsulant 62 to expose at least a portion of thick RDL traces 40, such as surface 44 of the thick RDL trace, to facilitate subsequent electrical interconnection. Openings 156 can be formed with straight, curved, sloped, or angled sidewalls 158. Accordingly, sidewalls 158 of openings 156 can also be formed perpendicular or substantially perpendicular to front surfaces 148 or 152. Openings 156 can have one or more widths or diameters W1 that extend in x and y directions across a surface 152 of panel 142. A cross-sectional shape of openings 156 can be circular, oval, square, rectangular, or any other shape, including elongated trenches. A height of openings or sidewalls 158 can be greater than, equal to, or less than width W1 of the openings. In an embodiment, openings 156 can be formed before encapsulant 62 is cured and before carrier 56, interface layer 58, or both, are removed. Alternatively, openings 156 can be formed after encapsulant 62 is cured and after carrier 56, interface layer 58, or both are removed.

In embodiments in which a portion of the thick RDL trace 40 is exposed by laser ablation or other non-grinding process, the thickness of the thick RDL trace 40 can be less than the thickness of the thick RDL trace 40 when the thick RDL trace 40 is exposed by grinding. As a non-limiting example, the thickness of the thick RDL trace 40 and can include a thickness in a range of, or substantially equal to, 4-20 μm, 4-15 μm, 4-10 μm, or 4-5 μm when the thick RDL trace 40 is exposed by laser ablation or other non-grinding process. As used herein, substantially equal to can include plus or minus 1 μm, 2 μm, or 3 μm, as well as less than 1 μm.

FIG. 5C shows a build-up interconnect structure 160 can be formed over panel 142 to provide for electrical connection between semiconductor die 24 and thickened RDL traces 44 and points external to the subsequently formed semiconductor package. Build-up interconnect structure 160 can comprise a number of RDLs comprising RDL traces, which can comprise part of a fan-out interconnect structure. Build-up interconnect structure 160 can be formed by the deposition and patterning of various insulating or passivation layers and the deposition and patterning of various conductive layers.

FIG. 5C shows a non-limiting example of build-up interconnect structure 160 in which insulating layer 162 is conformally applied to, and can have a first surface that follows the contours of, encapsulant 62 and top surface 44 of thick RDL traces 42. Insulation layer 162 can have a second planar surface opposite the first surface. Insulating layer 162 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 162 can be deposited using printing, spin coating, spray coating, lamination, or other suitable process. Insulating layer 162 can be subsequently patterned and cured using UV exposure followed by developing, or other suitable process. A portion of insulating layer 162 can be removed by laser ablation, etching, or other suitable process to form openings that expose portions of top surface 44 of thick RDL traces 42, according to the configuration and design of semiconductor die 24 and the final semiconductor package. In some embodiments, insulating layer 162 can be formed or deposited before the formation of openings 158 in encapsulant 62 so that the openings are formed both in and through insulating layer 162 and encapsulant 62. Alternatively, insulating layer 162 can be formed or deposited after the formation of openings 158 in encapsulant 62 so that the openings in the insulating layer are only formed through the insulating layer and extend to surface 44 of thick RDL traces 40.

An electrically conductive layer 164 can be patterned and deposited over, and in contact with, thick RDL traces 42, encapsulant 62, and insulation layer 162. Conductive layer 164 can be one or more layers of Al, Cu, Sn, Ni, Au, Ag, or other suitable electrically conductive material, and can include one or more of a seed layer, adhesion layer, or barrier layer. The deposition of conductive layer 164 can use PVD, CVD, electrolytic plating, electroless plating, or other suitable process. The openings in insulation layer 162 can extend completely through the insulation layer over thick RDL traces 40. Conductive layer 164 can operate as an RDL comprising a plurality of RDL traces that assist in extending electrical connection from semiconductor die 24 and thick conductive RDL traces 40 to points external to semiconductor die 24. A portion of conductive layer 164 formed within the openings in insulating layer 162 can form vertical interconnect structures or vias that provide electrical interconnection through insulating layer 162. While a non-limiting example of a build-up interconnect structure 160 is illustrated in FIG. 2C comprising a single RDL 164, additional RDLs can also be formed within build-up interconnect structure 160 between conductive layer 168 and thick RDL 40 to provide additional flexibility for routing signals between semiconductor die 24 and points external to the semiconductor die.

FIG. 5C further shows an insulating or passivation layer 166 is conformally applied to, and follows the contours of, insulation layer 162 and conductive layer 164. Insulating layer 166 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 166 can be deposited using printing, spin coating, spray coating, lamination, or other suitable process. Insulating layer 166 can be subsequently patterned and cured using UV exposure followed by developing, or other suitable process. A portion of insulating layer 166 can be removed by laser ablation, etching, or other suitable process to form openings through the insulating layer that expose portions of conductive layer 164.

An electrically conductive layer 168 can be patterned and deposited over, and be in contact with, conductive layer 164 and insulating layer 166. Conductive layer 168 can be one or more layers of Al, Cu, Sn, Ni, Au, Ag, or other suitable electrically conductive material. The deposition of conductive layer 168 can use PVD, CVD, electrolytic plating, electroless plating, or other suitable process. The openings in insulating layer 166 into which conductive layer 168 is disposed can extend completely through the insulation layer over conductive layer 164. At least a portion of conductive layer 168 can be formed within the openings in insulating layer 166 and form a vertical interconnect structure or vias that provide electrical interconnection through insulating layer 166 to connect to conductive layer 164.

Conductive layer 168 can comprise a top portion or surface that is formed as a pad 170. Pad 170 can comprise a horizontal component that includes an area greater than an area of the opening formed in insulating layer 166 such that pad 170 of conductive layer 168 extends over a top or upper surface of insulating layer 166. Pad 170 of conductive layer 168 can be an I/O interconnect at a periphery of a completed semiconductor package. As such, pads 170 can be formed as UBM pads or LGA pads that are coupled to I/O interconnects at a periphery of a completed semiconductor package such as, for example, solder bumps; or alternatively, can be themselves I/O interconnects. Pads 170 can be stacks of multiple metal layers including adhesion, barrier, seed, and wetting layers. Pads 170 can comprise one or more layers of Ti, TiN, TiW, Al, Cu, Cr, CrCu, Ni, NiV, Pd, Pt, Au, Ag or other suitable material or combination of materials. In an embodiment, pads 170 can comprise a TiW seed layer, a Cu Seed layer, and a Cu UBM layer.

Figure 5D:
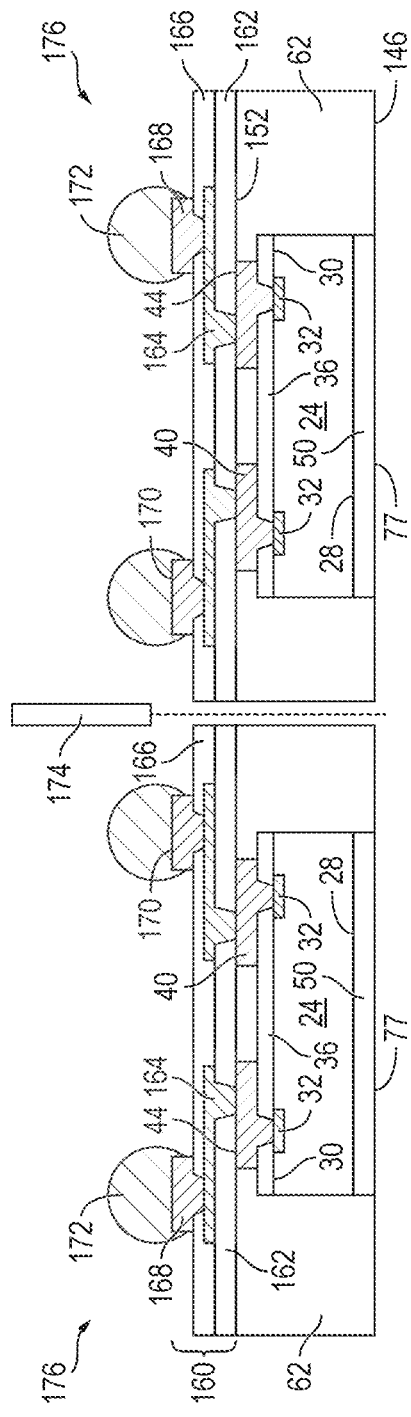

FIG. 5D shows an electrically conductive bump material can be deposited over pads 170, which as indicated above, can be UBM pads that act as an intermediate conductive layer between semiconductor die 24 and subsequently formed solder bumps or other I/O interconnect structures. Pads 170 can comprise UBM pads that provide a low resistive interconnect to conductive layers 164 and thick RDL traces 40, and can also provide a barrier to solder diffusion, and an increase in solder wettability. An electrically conductive bump material can be deposited over pads 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to pads 170 using a suitable attachment or bonding process.

In an embodiment, the bump material is reflowed by heating the material above its melting point to form spherical balls or bumps 172. In some applications, bumps 172 are reflowed a second time to improve electrical contact to pads 170. Bumps 172 can also be compression bonded to pads 170. Bumps 172 represent one type of interconnect structure that can be formed over pads 170. Other interconnect structures can also be used, including conductive paste, stud bump, micro bump, or other electrical interconnect.

Figure 6:
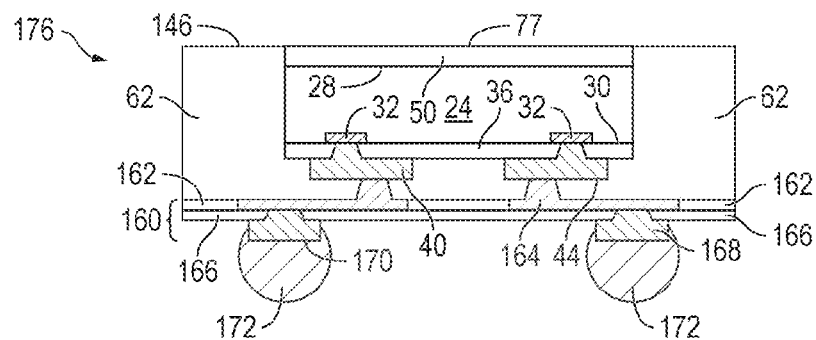
FIG. 6 illustrates a cross-sectional side view of another embodiment of a semiconductor package comprising thick conductive RDL traces.

FIG. 5D also shows that after the formation of package I/O interconnects, such as bumps 170, panel or reconstituted wafer 142 can be singulated using a saw blade or laser cutting tool 174 to form individual semiconductor packages or embedded die packages 176. FIG. 6 shows an individual semiconductor package or embedded die package 176 that is produced by the process illustrated in FIGS. 5A-5D.

Figure 7:
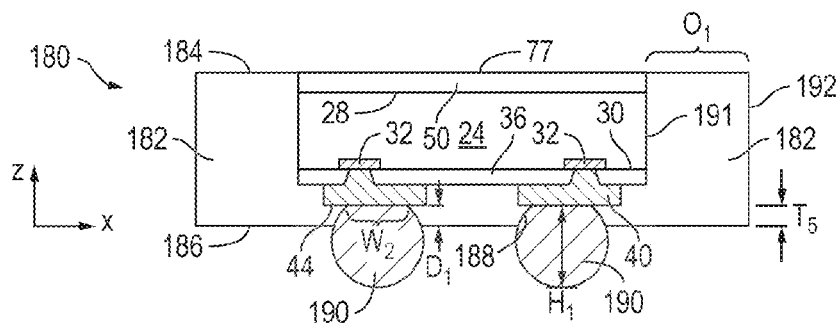
FIG. 7 illustrates a cross-sectional side view of another embodiment of a semiconductor package comprising thick conductive RDL traces.

FIG. 7 shows an individual semiconductor package or embedded die package 180 similar to semiconductor package 176 from FIG. 6. Semiconductor package 180 differs from semiconductor package 176 by omission of build-up interconnect structure 160. As such, a footprint of the thick conductive RDL traces 40 and the bumps or balls 190 can be contained within a footprint of the semiconductor die 24.

The thickness of the thick conductive RDL traces 40, as measured between the top surface of insulating or passivation layer 36 and the top surface 44 of the thick conductive RDL traces 40 can be in greater than on equal to 4-5 μm or enough material to act as a laser stop for the formation of openings or vias 188 through the encapsulant 182 by laser ablation. In other instances, when more destruction of material of the RDL traces 40, such as copper, is anticipated a greater thickness of the thick conductive RDL traces 40 can be used, such as thicknesses greater than or equal to 8-9 μm, or any other thickness as described above. In instances when the insulating or passivation layer 36 is not used, the thickness of the thick RDL 40 can be measured from the active surface 30 of the semiconductor die to the top surface 44 of the thick conductive RDL traces 40. When insulating or passivation layer 36 is omitted, the thick RDL 40 can be formed directly on the active surface 30 of the semiconductor die 24.

Package 180 comprises encapsulant 182 that comprises a back surface 184 and a front surface 186 opposite the back surface. Both back surface 184 and a front surface 186 can be substantially planar, and the back surface can also be substantially co-planar with back surface 77 of insulating layer 50. Front surface 186 of encapsulant 182 can be offset by a distance from surface 44 of thick RDL trace 40 such that a thickness T5 of encapsulant 182 can extend from front surface 186 of encapsulant 182 to surface 44 of thick RDL trace 40. The thickness T5 of encapsulant 182 between the top surface 44 of the thick conductive RDL traces 40 and the front surface 186 of the encapsulant 182 can be less than or equal to half a height H1 of bump 190. The thickness T5 can also be in a range of 10-40 μm.

Semiconductor package or embedded die package 180 presents an embodiment of an edge protected package or FOWLCSP, which differs in structure from conventional chip scale packages (CSPs) that are formed when the semiconductor die or packages are separated from each other and from their wafer form, such as by a diamond bladed saw. The separation of the CSPs can result in chipping or damage to a semiconductor die along the lines of separation or along a path of the saw blade. In some instances, a width of material removed by a saw can be in a range of 50-100 μm, or 50-70 μm, but in any event, the sawing adjacent the semiconductor die can cause chipping and damage to the semiconductor die. To the contrary, the risk of chipping the semiconductor die during sawing or singulation is reduced or eliminated with the inclusion of the encapsulant materials 182 disposed around lateral edges of the semiconductor die 24 to provide a buffer or offset between the semiconductor die 24 of the package 180, and the path of singulation or path of the saw blade, which results in the edge of the semiconductor die being protected from damage.

Other semiconductor packages or embedded die packages 194, 208, 218, 225, and 234 are shown in, and discussed with respect to, FIGS. 7-13 as presenting various embodiments of edge protected packages or FOWLCSPs.

Semiconductor package 180 shows an embodiment of an edge protected package with an offset, width, distance, or buffer O1 of encapsulant 182 disposed around and contacting at least four side surfaces of the semiconductor die 24 to create the offset O1 with a distance in a range of 30-140 μm, 30-100 μm, or 30-60 μm of the encapsulant material 182 around a periphery 191 of the semiconductor die 24 to prevent chipping of the semiconductor die 24 during singulation, to provide a robust package, and to provide periphery 192 or footprint of the semiconductor package 180 that is larger that the periphery and footprint of the semiconductor die 24 to absorb wear and tear, such as chipping, in place of the semiconductor die 24 absorbing the wear and tear. In some instances, the offset O1 can provide an area that is free from, or outside a footprint of, the thick RDLs 40.

As further shown in FIG. 7, a plurality of openings or vias 188 can be formed in encapsulant 182 through front surface 186 of encapsulant 182 by laser ablation, etching, or other suitable process. When the openings 188 are formed with laser ablation, a thickness or height of the thick RDL traces 40 can be formed with a thickness sufficient to act as a laser stop and to enable laser formation of the openings 188 through the encapsulant 182, which can include a thickness of 4-5 μm or more for the RDL traces 40. When other processes are used for formation of the vias and exposure of the RDLs, such as by grinding or other suitable process, a thickness of 8-9 μm or more for the RDL traces 40 can be used.

Openings 188 can extend completely through a portion of encapsulant 182 to expose at least a portion of thick RDL traces 40, such as surface 44 of the thick RDL trace, to facilitate subsequent electrical interconnection. Openings 188 can be formed with straight, curved, sloped, or angled sidewalls. Accordingly, sidewalls of openings 188 can also be formed perpendicular or substantially perpendicular to front surface 186. Openings 188 can have one or more widths or diameters W2 that extend in x and y directions across front surface 186 of semiconductor package 180. A cross-sectional shape of openings 188 can be circular, oval, square, rectangular, or any other shape, including elongated trenches. A height of openings 188 can be greater than, equal to, or less than width W2 of the openings. In an embodiment, openings 188 can be formed before encapsulant 182 is cured or fully cured and before a carrier, interface layer, or both, are removed from semiconductor die 24 and encapsulant 182. Alternatively, openings 188 can be formed after encapsulant 182 is cured and after the carrier, interface layer, or both are removed. Openings 188 can be configured to comprise a size and shape that is compatible and desirable for receiving or interfacing with a conductive bump structure, as described in greater detail below. As such, a size, volume, or cross-sectional area of openings 188 can be greater than a size, volume, or cross-sectional area of openings 156 shown in FIGS. 5B-5D.

After the formation of the opening 188 through the encapsulant 182 to the thick RDL trace 40, the thick RDL trace 40, the encapsulant 182, and the opening 188 can undergo an optional etch or acid etch before undergoing a ball drop process or the formation of bumps or balls 190.

FIG. 7 also shows an electrically conductive bump material can be deposited over, and be in contact with, thick RDL traces 40. In some instances, the bumps or balls 190 can be formed in direct contact with or directly on a top surface 44 of thick conductive RDL traces 40. The bumps 190 can be formed by an electrically conductive bump material being deposited over thick RDL traces 40 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to thick RDL traces 40 using a suitable attachment or bonding process. In an embodiment, the bump material is reflowed by heating the material above its melting point to form spherical balls or bumps 190. In some applications, bumps 190 are reflowed a second time to improve electrical contact to thick RDL traces 40. Bumps 190 can also be compression bonded to thick RDL traces 40. Bumps 190 represent one type of interconnect structure that can be formed over thick RDL traces 40. Other interconnect structures can also be used, including conductive paste, stud bump, micro bump, or other electrical interconnect. In some instances, the depth or distance D1 of the openings 188 will be less than or equal to half a height H1 of the bumps 190. As an example, the height H1, which can equal the diameter of the bumps 190, can be in a range of 150-300 µm.

Figure 8:
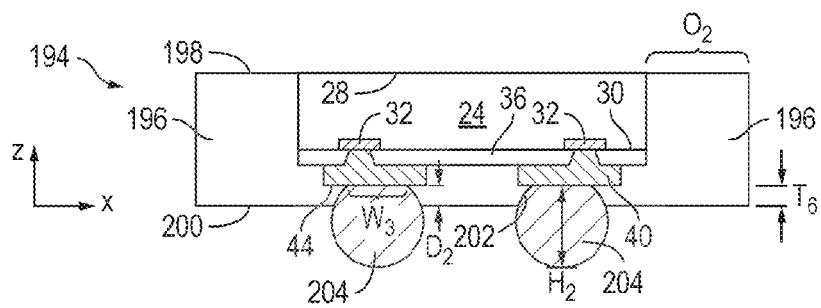
FIG. 8 illustrates a cross-sectional side view of another embodiment of a semiconductor package comprising thick conductive RDL traces.

FIG. 8 shows an individual semiconductor package or embedded die package 194 similar to semiconductor package 180 from FIG. 7. Semiconductor package 194 differs from semiconductor package 180 by omission of insulating layer 50. Instead, of having an insulating layer 50 disposed over back surface 28 of semiconductor die 24, FIG. 8 shows back surface 28 can be exposed as part of semiconductor package 194. Semiconductor package 194 comprises encapsulant 196 that comprises a back surface 198 and a front surface 200 opposite the back surface. Both back surface 198 and a front surface 200 can be substantially planar, and the back surface can also be substantially co-planar with back surface 28 of semiconductor die 24. Front surface 200 of encapsulant 196 can be offset by a distance from surface 44 of thick RDL trace 40 such that a thickness T6 of encapsulant 196 can extend from front surface 200 of encapsulant 196 to surface 44 of thick RDL trace 40. The thickness T6 of encapsulant 196 between the top surface 44 of the thick conductive RDL traces 40 and the front surface 200 of the encapsulant 196 can be less than or equal to half a height H2 of bump or balls 204. The thickness T6 can also be in a range of 10-40 µm.

Semiconductor package 194 shows an embodiment of an edge protected package with an offset, width, distance, or buffer O2 of encapsulant 196 disposed around and contacting at least four side surfaces of the semiconductor die 24 to create the offset O2 with a distance in a range of 30-140 µm, 30-100 µm, or 30-60 µm of the encapsulant material 196 around a periphery 191 of the semiconductor die 24 to prevent chipping of the semiconductor die 24 during singulation, to provide a robust package, and to provide periphery 192 or footprint of the semiconductor package 194 that is larger that the periphery and footprint of the semiconductor die 24 to absorb wear and tear, such as chipping, in place of the semiconductor die 24 absorbing the wear and tear. In some instances, the offset O2 can provide an area that is free from, or outside a footprint of, the thick RDLs 40.

As further shown in FIG. 8, a plurality of openings or vias 202 can be formed in encapsulant 196 through front surface 200 of encapsulant 196 by laser ablation, etching, or other suitable process. Openings 202 can extend completely through a portion of encapsulant 196 to expose at least a portion of thick RDL traces 40, such as surface 44 of the thick RDL trace, to facilitate subsequent electrical interconnection. Openings 202 can be formed with straight, curved, sloped, or angled sidewalls. Accordingly, sidewalls of openings 202 can also be formed perpendicular or substantially perpendicular to front surface 200. Openings 202 can have one or more widths or diameters W3 that extend in x and y directions across front surface 200 of semiconductor package 194. A cross-sectional shape of openings 202 can be circular, oval, square, rectangular, or any other shape, including elongated trenches. A height of openings 202 can be greater than, equal to, or less than width W3 of the openings. In an embodiment, openings 202 can be formed before encapsulant 196 is cured or fully cured before a carrier, interface layer, or both, are removed from semiconductor die 24 and encapsulant 196. Alternatively, openings 202 can be formed after encapsulant 196 is cured and after the carrier, interface layer, or both are removed. Openings 202 can be configured to comprise a size and shape that is compatible and desirable for receiving or interfacing with a conductive bump structure, as described in greater detail below. As such, a size, volume, or cross-sectional area of openings 202 can be greater than a size, volume, or cross-sectional area of openings 156 shown in FIGS. 5B-5D.

FIG. 8 also shows an electrically conductive bump material can be deposited over, and be in contact with, thick RDL traces 40. An electrically conductive bump material can be deposited over thick RDL traces 40 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to thick RDL traces 40 using a suitable attachment or bonding process. In an embodiment, the bump material is reflowed by heating the material above its melting point to form spherical balls or bumps 204. In some applications, bumps 204 are reflowed a second time to improve electrical contact to thick RDL traces 40. Bumps 204 can also be compression bonded to thick RDL traces 40. Bumps 204 represent one type of interconnect structure that can be formed over thick RDL traces 40. Other interconnect structures can also be used, including conductive paste, stud bump, micro bump, or other electrical interconnect. In some instances, the depth or distance D2 of the openings 202 will be less than or equal to half a height H2 of the bumps 204. As an example, the height H2, which can equal the diameter of the bumps 204, can be in a range of 150-300 µm.

Figure 9:
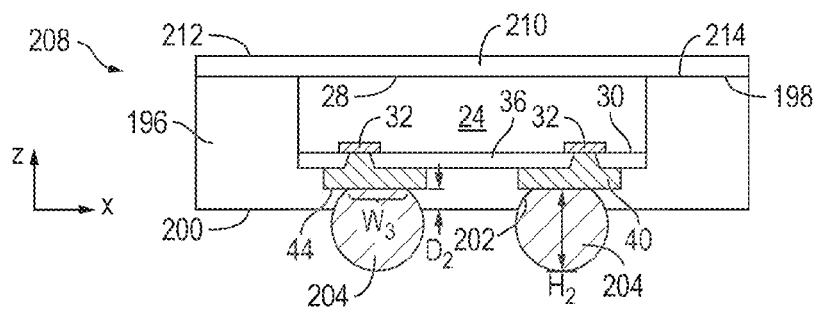
FIG. 9 illustrates a cross-sectional side view of another embodiment of a semiconductor package comprising thick conductive RDL traces.

FIG. 9 shows an individual semiconductor package or embedded die package 208 similar to semiconductor package 194 from FIG. 8. Semiconductor package 208 differs from semiconductor package 194 by the inclusion of insulating or passivation layer 210. Insulating layer 210 can be an epoxy film, a thermal epoxy, epoxy resin, B-stage epoxy film, UV B-stage film with optional acrylic polymer, dielectric film, or other suitable material. Insulating layer 210 can be disposed over substantially an entirety of a backside of semiconductor package 208, and as such can comprise a footprint substantially equal to a footprint of semiconductor package 208, instead of smaller footprint substantially equal to an area of semiconductor die 24 as shown in the semiconductor packages of FIGS. 6 and 7. Insulating layer 210 can comprise a back surface 212 and a front surface 214 opposite the back surface. Both back surface 212 and a front surface 214 can be substantially planar, and the front surface can also be substantially co-planar with back surface 198 of encapsulant 196 and back surface 28 of semiconductor die 24.

Semiconductor package 218 also shows an embodiment of an edge protected package with an offset, width, distance, or buffer O3 of encapsulant 196 disposed around and contacting at least four side surfaces of the semiconductor die 24 to create the offset O3 with a distance in a range of 30-140 μm, 30-100 μm, or 30-60 μm of the encapsulant material 196 around a periphery 191 of the semiconductor die 24 to prevent chipping of the semiconductor die 24 during singulation, to provide a more robust package, and to provide periphery 192 or footprint of the semiconductor package 208 that is larger that the periphery and footprint of the semiconductor die 24 to absorb wear and tear, such as chipping, in place of the semiconductor die 24 absorbing the wear and tear. In some instances, the offset O3 can provide an area that is free from, or outside a footprint of, the thick RDLs 40.

Figure 10:
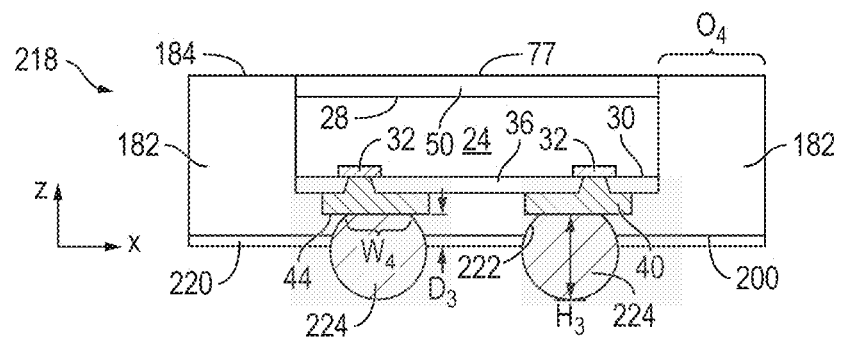
FIG. 10 illustrates a cross-sectional side view of another embodiment of a semiconductor package comprising thick conductive RDL traces.

FIG. 10 shows an individual semiconductor package or embedded die package 218 similar to semiconductor package 180 from FIG. 7. Semiconductor package 218 differs from semiconductor package 194 by inclusion of insulating or passivation layer 220 that can comprise a first planar surface that is conformally applied to, and directly contacts, front surface 200 of encapsulant 196. Insulation layer 220 can have a second planar surface opposite the first surface. Insulating layer 220 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 220 can be deposited using printing, spin coating, spray coating, lamination, or other suitable process. Insulating layer 220 can be subsequently patterned and cured using UV exposure followed by developing, or other suitable process. In an embodiment, insulting layer 220 can be an organic or inorganic passivation film that is formed over encapsulant 196 before the formation of openings or vias 222 by laser drilling to help prevent reliability failures under electrical bias. For example, insulating layer 220 can prevent migration of ions across the layer 220.

By forming package 218 with insulating layer 220 and without the build-up interconnect structure 160, as shown in FIG. 6 as part of package 176, package 218, like packages 180, 194, 208225 and 234 can have higher coefficients of thermal expansion (CTE) and lower elastic moduli than conventional fan-out structures, and without the shrinkage issues presented with mold compound in conventional packages.

Openings 222 can be formed in insulating layer 220 and in encapsulant 182 through front surface 186 of encapsulant 182 by laser ablation, etching, or other suitable process. Openings 222 can extend completely through insulating layer 220 and a portion of encapsulant 182 to expose at least a portion of thick RDL traces 40, such as surface 44 of the thick RDL trace, to facilitate subsequent electrical interconnection. Openings 220 can be formed with straight, curved, sloped, or angled sidewalls. Accordingly, sidewalls of openings 220 can also be formed perpendicular or substantially perpendicular to front surface 186. Openings 220 can have one or more widths or diameters W4 that extend in x and y directions across front surface 186 of semiconductor package 218. A cross-sectional shape of openings 222 can be circular, oval, square, rectangular, or any other shape, including elongated trenches. A height of openings 222 can be greater than, equal to, or less than width W2 of the openings. In an embodiment, openings 222 can be formed before encapsulant 182 and insulating layer 220 is cured or fully cured and before a carrier, interface layer, or both, are removed from semiconductor die 24 and encapsulant 182. Alternatively, openings 222 can be formed after encapsulant 182 and insulating layer 220 is cured and after the carrier, interface layer, or both are removed. Openings 222 can be configured to comprise a size and shape that is compatible and desirable for receiving or interfacing with a conductive bump structure, as described in greater detail below. As such, a size, volume, or cross-sectional area of openings 222 can be greater than a size, volume, or cross-sectional area of openings 156 shown in FIGS. 5B-5D.

In some instances the encapsulant 182 can be formed as a photo-imagable epoxy or other suitable material in which the openings or vias 22 can be formed by photo-imaging to receive bumps or balls 224. In such instances, the encapsulant 182 can be formed of a very thick dry film resist. Alternatively, the encapsulant 182 can also be dispensed like a mold compound, and with mechanical properties similar to mold compound, without the encapsulant 182 being laminated.

Semiconductor package 218 shows an embodiment of an edge protected package with an offset, width, distance, or buffer O4 of encapsulant 182 disposed around and contacting at least four side surfaces of the semiconductor die 24 to create the offset O4 with a distance in a range of 30-140 μm, 30-100 μm, or 30-60 μm of the encapsulant material 182 around a periphery 191 of the semiconductor die 24 to prevent chipping of the semiconductor die 24 during singulation, to provide a robust package, and to provide periphery 192 or footprint of the semiconductor package 218 that is larger that the periphery and footprint of the semiconductor die 24 to absorb wear and tear, such as chipping, in place of the semiconductor die 24 absorbing the wear and tear. In some instances, the offset O4 can provide an area that is free from, or outside a footprint of, the thick RDLs 40.

FIG. 10 also shows an electrically conductive bump material can be deposited over, and be in contact with, thick RDL traces 40, encapsulant 182, and insulating layer 220. An electrically conductive bump material can be deposited over thick RDL traces 40 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to thick RDL traces 40 using a suitable attachment or bonding process. In an embodiment, the bump material is reflowed by heating the material above its melting point to form spherical balls or bumps 224. In some applications, bumps 224 are reflowed a second time to improve electrical contact to thick RDL traces 40. Bumps 224 can also be compression bonded to thick RDL traces 40. Bumps 224 represent one type of interconnect structure that can be formed over thick RDL traces 40. Other interconnect structures can also be used, including conductive paste, stud bump, micro bump, or other electrical interconnect. In some instances, the depth or distance D3 of the openings 222 will be less than or equal to half a height H3 of the bumps 224.

As an example, the height H3, which can equal the diameter of the bumps 224, can be in a range of 150-300 μm.

Figure 11:
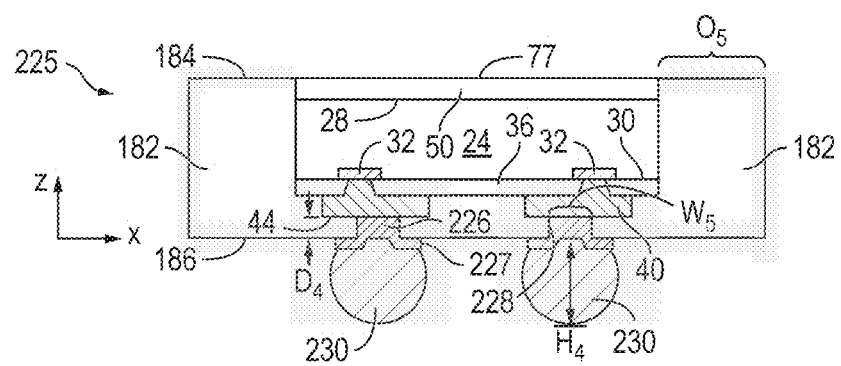
FIG. 11 illustrates a cross-sectional side view of another embodiment of a semiconductor package comprising thick conductive RDL traces.

FIG. 11 shows an individual semiconductor package or embedded die package 225 similar to semiconductor package 180 from FIG. 7. Semiconductor package 225 differs from semiconductor package 180 by inclusion of conductive interconnects or BGA pads 226 that extend between, and provide electrical interconnect connection between, thick RDLs 40 and points external to semiconductor package 225. Conductive interconnects 226 can be formed at least partially in openings or vias 228 without additional routing between the thick conductive RDL traces 40 and the bumps or balls 230. Openings 228 can be formed in encapsulant 182 through front surface 186 of encapsulant 182 by laser ablation, etching, or other suitable process. Openings 228 can extend completely through a portion of encapsulant 182 to expose at least a portion of thick RDL traces 40, such as surface 44 of the thick RDL trace, to facilitate subsequent electrical interconnection. Openings 228 can be formed with straight, curved, sloped, or angled sidewalls. Accordingly, sidewalls of openings 228 can also be formed perpendicular or substantially perpendicular to front surface 186. Openings 220 can have one or more widths or diameters W5 that extend in x and y directions across front surface 186 of semiconductor package 225. A cross-sectional shape of openings 228 can be circular, oval, square, rectangular, or any other shape, including elongated trenches. A height of openings 228 can be greater than, equal to, or less than width W5 of the openings. In an embodiment, openings 228 are formed with a height greater than a width so that conductive interconnects 226 formed within openings 228 are configured as conductive pillars comprising a height greater than a width W5. The width W5 can be in a range of 50-150 μm and can be less than the widths W2-W4 when the bump is formed directly on the thick RDL. By forming vias or openings 228 with a smaller or narrower width W5, the vias 228 can be made smaller, more quickly, and at less expense.

Conductive interconnects 226 can comprise a height in a range of, or substantially equal to, 20-100 μm. In an embodiment, openings 228 can be formed before encapsulant 182 is cured or fully cured and before a carrier, interface layer, or both, are removed from semiconductor die 24 and encapsulant 182. Alternatively, openings 228 can be formed after encapsulant 182 is cured and after the carrier, interface layer, or both are removed.

Conductive interconnects 226 can also be formed so that a portion of conductive interconnects 226 are formed as pads 227. Pads 227 can be adjacent front surface 186 of encapsulant 182 and can comprise an area larger than an area of opening 228 and a width greater than width W5 such that pads 227 of conductive interconnects 226 extend over a top or upper surface of front surface 186 of encapsulant 182. Pads 227 of conductive interconnects 226 can be an I/O interconnect at a periphery of a completed semiconductor package. As such, pads 227 can be formed as UBM pads, which as described in greater detail below, can form an interface between signals transmitted with respect to semiconductor die 24 and the package I/O interconnects. Alternatively, pads 227 can be formed as LGA pads that are themselves I/O interconnects at a periphery of a completed semiconductor package, and are not coupled to other I/O interconnects such as, for example, solder bumps. Pads 227 can be stacks of multiple metal layers including adhesion, barrier, seed, and wetting layers. Pads 227 can comprise one or more layers of Ti, TiN, TiW, Al, Cu, Cr, CrCu, Ni, NiV, Pd, Pt, Au, Ag or other suitable material or combination of materials. In an embodiment, pads 227 can comprise a TiW seed layer, a Cu Seed layer, and a Cu UBM layer. In some instances elements 226 and 227 can be made at a same time, as part of a same processing step, and can be formed as part of a same integrally formed structure. The distance or height D4 of conductive interconnect 226 and via 228 can each be in a range of 10-40 μm.

FIG. 11 also shows an electrically conductive bump material can be deposited over, and be in contact with encapsulant 182, and conductive interconnects 226. An electrically conductive bump material can be deposited over conductive interconnects 226 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to conductive interconnects 226 using a suitable attachment or bonding process. In an embodiment, the bump material is reflowed by heating the material above its melting point to form spherical balls or bumps 230. In some applications, bumps 230 are reflowed a second time to improve electrical contact to conductive interconnects 226. Bumps 230 can also be compression bonded to conductive interconnects 226. Bumps 230 represent one type of interconnect structure that can be formed over conductive interconnects 226. Other interconnect structures can also be used, including conductive paste, stud bump, micro bump, or other electrical interconnect.

FIG. 11 also shows the semiconductor the package 225 can comprise an edge protected package with an offset, width, distance, or buffer O5 of encapsulant 182 disposed around and contacting at least four side surfaces of the semiconductor die 24 to create an the offset O5 with a distance in a range of 30-140 μm, 30-100 μm, or 30-60 μm of the encapsulant material 182 around a periphery 191 of the semiconductor die 24 to prevent chipping of the semiconductor die 24 during singulation, to provide a robust package, and to provide periphery 192 or footprint of the semiconductor package 194 that is larger that the periphery and footprint of the semiconductor die 24 to absorb wear and tear, such as chipping, in place of the semiconductor die 24 absorbing the wear and tear. In some instances, the offset O5 can provide an area that is free from, or outside a footprint of, the thick RDLs 40.

Figure 12:
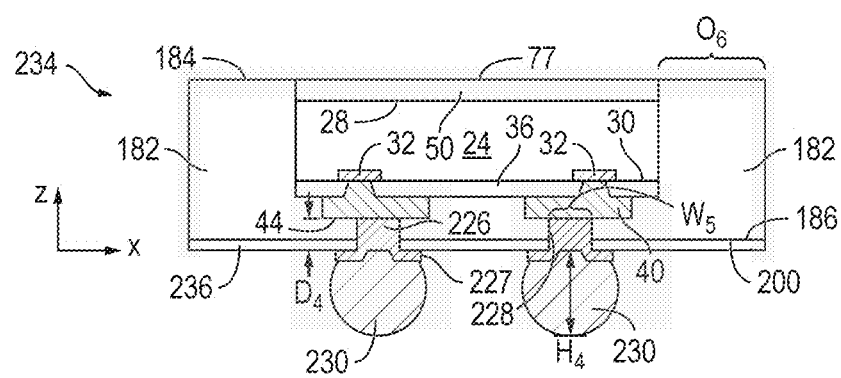
FIG. 12 illustrates a cross-sectional side view of another embodiment of a semiconductor package comprising thick conductive RDL traces.

FIG. 12 shows an individual semiconductor package or embedded die package 234 similar to semiconductor package 225 from FIG. 11. Semiconductor package 234 differs from semiconductor package 225 by inclusion of insulating or passivation layer 236 that can comprise a first planar surface that is conformally applied to, and directly contacts, front surface 186 of encapsulant 182. Insulation layer 236 can have a second planar surface opposite the first surface. Insulating layer 236 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 236 can be deposited using printing, spin coating, spray coating, lamination, or other suitable process. Insulating layer 236 can be subsequently patterned and cured using UV exposure followed by developing, or other suitable process. In an embodiment, insulting layer 236 can be an organic or inorganic passivation film that is formed over encapsulant 182 before the formation of openings 228 by laser drilling to help prevent reliability failures under electrical bias. In other embodiments, openings 228 can be formed before the formation of insulating layer 236.

Inclusion of the insulating layer 236 can provide a cushion for the package 234 and for the bumps 230 to improve reliability, such as by improving performance in drop tests and during thermal cycling. The optional insulating layer 236 can be added to larger packages, such as packages with side lengths of 4-6 millimeters (mm) or more, that tend to have greater difficulty in performing adequately in drop test and thermal cycling tests. Otherwise, openings 228, conductive interconnects 226, pads 227, and bumps 230 can be identical or substantially identical to those of package 225 as described above with respect to FIG. 11.

FIG. 12 also shows the semiconductor the package 234 can comprise an edge protected package with an offset, width, distance, or buffer O6 of encapsulant 182 disposed around and contacting at least four side surfaces of the semiconductor die 24 to create an the offset O6 with a distance in a range of 30-140 μm, 30-100 μm, or 30-60 μm of the encapsulant material 182 around a periphery 191 of the semiconductor die 24 to prevent chipping of the semiconductor die 24 during singulation, to provide a robust package, and to provide periphery 192 or footprint of the semiconductor package 194 that is larger than the periphery and footprint of the semiconductor die 24 to absorb wear and tear, such as chipping, in place of the semiconductor die 24 absorbing the wear and tear. In some instances, the offset O6 can provide an area that is free from, or outside a footprint of, the thick RDLs 40.

Figure 13:
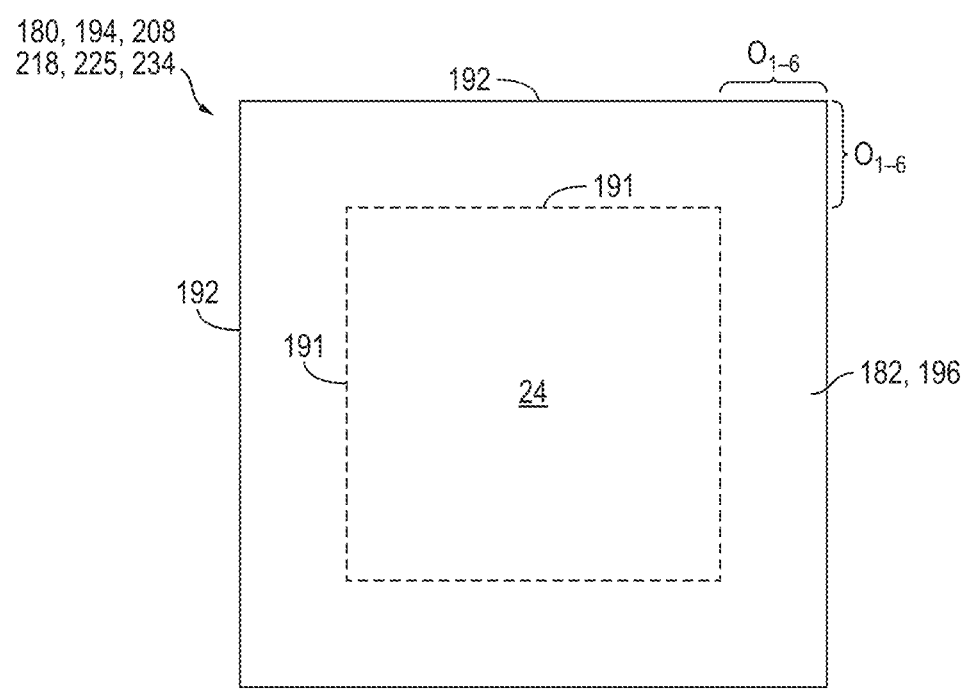
FIG. 13 illustrates a top or plan view of a semiconductor package.

FIG. 13 shows a top or plan view of an edge protected package like packages 180, 194, 208, 218, 225, and 234 with an offset, width, distance, or buffer O1, O2, O3, O4, O5, and O6, respectively.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a plurality semiconductor packages, comprising:
   forming a plurality of redistribution layer (RDL) traces comprising a thickness greater than 8 μm disposed over active surfaces of a plurality of semiconductor die and electrically connected to contact pads on the plurality of semiconductor die, and further forming the plurality of RDL traces as fan-in structures for each of the plurality of semiconductor die within a footprint of each of their respective semiconductor die;
   disposing an encapsulant material over the active surfaces, contacting at least four side surfaces of each of the plurality of semiconductor die, and disposed over the plurality of RDL traces;
   forming a via through the encapsulant material to expose at least one of the plurality of RDL traces;
   forming an electrical interconnect structure disposed within the via and coupled to the at least one RDL trace;
   forming a ball grid array (BGA) pad between the RDL and the electrical interconnect structure; and
   singulating the plurality of semiconductor packages through the encapsulant material to leave an offset of 30-140 μm of the encapsulant material disposed around a periphery of each of the plurality of semiconductor die.

2. The method of claim 1, further comprising:
   forming the plurality of RDL traces comprising a thickness or height greater than 20 μm; and
   forming the via through the encapsulant material using laser ablation, wherein the encapsulant material is a non-photoimagable material.

3. The method of claim 1, further comprising:
   forming the electrical interconnect structure as a conductive bump; and
   forming the via with a depth less than or equal to half a height of the conductive bump.

4. The method of claim 3, further comprising forming the encapsulant material over the plurality of RDL traces with a thickness of encapsulant in a range of 10-40 μm.

5. The method of claim 3, further comprising forming an epoxy coating or dielectric film on the encapsulant material at a frontside or backside of the encapsulant material.

6. A method of making a semiconductor package, comprising:
   forming a plurality of redistribution layer (RDL) traces comprising a thickness greater than 20 μm connected to contact pads on an active surface of a semiconductor die;
   disposing an encapsulant material over the RDL traces and contacting at least four side surfaces of the semiconductor die to create an offset of 30-140 μm of the encapsulant material around a periphery of the semiconductor die, wherein the encapsulant material is formed over the RDL traces with a thickness of encapsulant in a range of 10-40 μm;
   exposing at least one of the plurality of RDL traces by a via through the encapsulant material; and
   forming an electrical interconnect as a conductive bump at least partially disposed within the via and coupled to the at least one RDL trace.

7. The method of claim 6, further comprising:
   forming the thickness of the plurality of RDL traces comprising a thickness or height so that a height of the RDL traces is greater than a minimum width of the RDL traces; and
   forming a via through the encapsulant material using laser ablation to expose the at least one of the plurality of thickened RDL traces with respect to the encapsulant material, wherein the encapsulant material is a non-photoimagable material.

8. The method of claim 6, further comprising forming the plurality of RDL traces for each of the plurality of semiconductor die within a footprint of each of the respective semiconductor die.

9. The method of claim 8, further comprising forming a ball grid array (BGA) pad between the RDL and the electrical interconnect.

10. The method of claim 8, further comprising forming an epoxy coating or dielectric film over the semiconductor die at a frontside or a backside of the semiconductor package.

11. The method of claim 8, further comprising disposing encapsulant material over the active surface and at least four side surfaces of the semiconductor die and over the plurality of RDL traces in a single step.

12. A semiconductor package, comprising:
   a redistribution layer (RDL) trace comprising a thickness greater than 4 μm disposed over an active surface of a semiconductor die and disposed within a footprint of the semiconductor die;
   an encapsulant material disposed over the RDL trace with a thickness of encapsulant over the RDL trace in a range of 10-40 μm and the encapsulant material further contacting side surfaces of the semiconductor die to create an offset of 30-140 μm of the encapsulant material around a periphery of the semiconductor die, wherein the offset is outside a footprint of the thick RDL trace;

a via formed in the encapsulant material and exposing the RDL trace; and a conductive interconnect disposed within the via and coupled to the RDL trace.

13. The semiconductor package of claim 12, wherein the thickness of the RDL trace comprises a thickness or height greater than 20 μm.

14. The semiconductor package of claim 12, wherein the plurality of RDL traces comprise a thickness or height greater than a width.

15. The semiconductor package of claim 12, wherein the plurality of RDL traces are completely disposed within a footprint of the semiconductor die.

16. The semiconductor package of claim 15, further comprising an epoxy coating or dielectric film formed at a backside or frontside of the semiconductor package.

17. The semiconductor package of claim 12, wherein:

the via comprises a depth (D); and the electrical interconnect is a conductive bump comprising a height (H) greater than or equal to twice a depth of the via.

* * * * *